(12) United States Patent
Rathburn

(10) Patent No.: US 7,160,119 B2
(45) Date of Patent: *Jan. 9, 2007

(54) CONTROLLED COMPLIANCE FINE PITCH ELECTRICAL INTERCONNECT

(75) Inventor: James J. Rathburn, Greenfield, MN (US)

(73) Assignee: Gryphics, Inc., Plymouth, MN (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/992,482

(22) Filed: Nov. 17, 2004

(65) Prior Publication Data

US 2005/0099763 A1    May 12, 2005

Related U.S. Application Data

(62) Division of application No. 10/031,422, filed as application No. PCT/US00/20748 on Jul. 31, 2000, now Pat. No. 6,830,460.

(60) Provisional application No. 60/146,825, filed on Aug. 2, 1999.

(51) Int. Cl.
  *H01R 12/24*    (2006.01)
(52) U.S. Cl. ............... 439/77; 439/700; 439/71
(58) Field of Classification Search ............ 439/67, 439/66, 289, 492, 499, 700, 71, 77
See application file for complete search history.

(56) References Cited

U.S. PATENT DOCUMENTS

| | | |
|---|---|---|
| 2,958,064 A | 10/1960 | Swengel |
| 3,880,488 A | 4/1975 | Avaklan |
| 3,904,934 A | 9/1975 | Martin |
| 3,964,813 A | 6/1976 | Pizzeck |
| 4,118,090 A | 10/1978 | Del Mei |
| 4,161,346 A | 7/1979 | Cherian et al. |
| 4,165,909 A | 8/1979 | Yeager et al. |

(Continued)

FOREIGN PATENT DOCUMENTS

EP    0 310 302 A2    4/1989

(Continued)

OTHER PUBLICATIONS

Silicone Contact Technology for Test and Burn-In of FBGA Packages, pp. 1-12, Bear Technology Inc. (1997).

*Primary Examiner*—Neil Abrams
(74) *Attorney, Agent, or Firm*—Faegre & Benson LLP

(57) ABSTRACT

A method and apparatus for achieving a very fine pitch interconnect between a flexible circuit member and another circuit member with extremely co-planar electrical contacts that have a large range of compliance. An electrical interconnect assembly that can be used as a die-level test probe, a wafer probe, and a printed circuit probe is also disclosed. The second circuit member can be a printed circuit board, another flexible circuit, a bare-die device, an integrated circuit device, an organic or inorganic substrate, a rigid circuit and virtually any other type of electrical component. A plurality of electrical contacts are arranged in a housing. The electrical contacts may be arranged randomly or in a one or two-dimensional array. The housing acts as a receptacle to individually locate and generally align the electrical contacts, while preventing adjacent contacts from touching. The first ends of the electrical contacts are electrically coupled to a flexible circuit member. The second ends of the electrical contacts are free to electrically couple with one or more second circuit members without the use of solder.

A compliant material may be positioned along a second surface of the flexible circuit to bias the electrical contacts against the one or more second circuit members.

44 Claims, 19 Drawing Sheets

U.S. PATENT DOCUMENTS

| | | | |
|---|---|---|---|
| 4,189,200 A | 2/1980 | Yeager et al. | |
| 4,445,735 A | 5/1984 | Bonnefoy | |
| 4,468,074 A | 8/1984 | Gordon | |
| 4,498,722 A | 2/1985 | Fedder et al. | |
| 4,509,099 A | 4/1985 | Takamatsu et al. | |
| 4,528,500 A | 7/1985 | Lightbody et al. | |
| 4,548,451 A | 10/1985 | Benarr et al. | |
| 4,575,170 A | 3/1986 | Gurley | |
| 4,579,411 A | 4/1986 | Cobaugh et al. | |
| 4,593,961 A | 6/1986 | Cosmo | |
| 4,603,928 A | 8/1986 | Evans | |
| 4,610,495 A | 9/1986 | Landi | |
| 4,629,270 A | 12/1986 | Andrews, Jr. et al. | |
| 4,648,668 A | 3/1987 | Sinisi | |
| 4,655,524 A | 4/1987 | Etzel | |
| 4,691,972 A | 9/1987 | Gordon | |
| 4,700,132 A | 10/1987 | Yarbrough et al. | |
| 4,758,176 A | 7/1988 | Abe et al. | |
| 4,768,971 A | 9/1988 | Simpson | |
| 4,789,345 A | 12/1988 | Carter | |
| 4,793,814 A | 12/1988 | Zifcak et al. | |
| 4,872,853 A | 10/1989 | Webster | |
| 4,881,901 A * | 11/1989 | Mendenhall et al. | 439/65 |
| 4,904,197 A | 2/1990 | Cabourne | |
| 4,913,656 A | 4/1990 | Gordon et al. | |
| 4,927,369 A | 5/1990 | Grabbe et al. | |
| 4,954,878 A | 9/1990 | Fox et al. | |
| 4,976,626 A | 12/1990 | Dibble et al. | |
| 5,007,842 A | 4/1991 | Deak et al. | |
| 5,044,992 A | 9/1991 | Dzwonczyk et al. | |
| 5,049,084 A | 9/1991 | Bakke | |
| 5,061,192 A | 10/1991 | Chapin et al. | |
| 5,071,359 A | 12/1991 | Arnio et al. | |
| 5,096,426 A | 3/1992 | Simpson et al. | |
| 5,099,393 A | 3/1992 | Bentlage et al. | |
| 5,127,837 A * | 7/1992 | Shah et al. | 439/71 |
| 5,152,695 A | 10/1992 | Grabbe et al. | |
| 5,156,553 A | 10/1992 | Katsumata et al. | |
| 5,163,834 A | 11/1992 | Chapin et al. | |
| 5,167,512 A | 12/1992 | Walkup | |
| 5,173,055 A | 12/1992 | Grabbe | |
| 5,199,889 A | 4/1993 | McDevitt, Jr. | |
| 5,203,075 A | 4/1993 | Angulas et al. | |
| 5,205,739 A * | 4/1993 | Malo et al. | 439/66 |
| 5,207,585 A | 5/1993 | Byrnes et al. | |
| 5,227,959 A | 7/1993 | Rubinstein et al. | |
| 5,252,916 A | 10/1993 | Swart | |
| 5,295,839 A * | 3/1994 | Grange et al. | 439/67 |
| 5,299,090 A | 3/1994 | Brady et al. | |
| 5,321,884 A | 6/1994 | Ameen et al. | |
| 5,324,205 A | 6/1994 | Ahmad et al. | |
| 5,338,207 A | 8/1994 | Lineberry et al. | |
| 5,342,205 A | 8/1994 | Hashiguchi | |
| 5,358,412 A | 10/1994 | Maurinus et al. | |
| 5,388,998 A | 2/1995 | Grange et al. | |
| 5,395,252 A | 3/1995 | White | |
| 5,410,260 A | 4/1995 | Kazama | |
| 5,412,329 A | 5/1995 | Iino et al. | |
| 5,427,535 A | 6/1995 | Sinclair | |
| 5,437,556 A | 8/1995 | Bargain et al. | |
| 5,447,442 A * | 9/1995 | Swart | 439/77 |
| 5,519,331 A | 5/1996 | Cowart et al. | |
| 5,521,519 A | 5/1996 | Faure et al. | |
| 5,548,488 A | 8/1996 | Hansen | |
| 5,637,539 A | 6/1997 | Hofmann et al. | |
| 5,645,433 A | 7/1997 | Johnson | |
| 5,652,608 A | 7/1997 | Watanabe et al. | |
| 5,653,598 A | 8/1997 | Grabbe | |
| 5,706,174 A | 1/1998 | Distefano et al. | |
| 5,723,347 A | 3/1998 | Hirano et al. | |
| 5,772,451 A | 6/1998 | Dozier, II et al. | |
| 5,795,172 A | 8/1998 | Shahriari et al. | |
| 5,829,988 A | 11/1998 | McMillan et al. | |
| 5,913,687 A | 6/1999 | Rathburn | |
| 5,920,765 A | 7/1999 | Naum et al. | |
| 5,923,178 A | 7/1999 | Higgins et al. | |
| 5,938,451 A | 8/1999 | Rathburn | |
| 5,947,749 A | 9/1999 | Rathburn | |
| 5,984,691 A | 11/1999 | Brodsky et al. | |
| 6,079,987 A | 6/2000 | Matsunaga et al. | |
| 6,094,115 A | 7/2000 | Nguyen et al. | |
| 6,135,783 A | 10/2000 | Rathburn | |
| 6,174,174 B1 | 1/2001 | Suzuki et al. | |
| 6,178,629 B1 | 1/2001 | Rathburn | |
| 6,210,173 B1 | 4/2001 | Matsunaga | |
| 6,231,353 B1 | 5/2001 | Rathburn | |
| 6,247,938 B1 | 6/2001 | Rathburn | |
| 6,294,920 B1 | 9/2001 | Pfaff | |
| 6,312,266 B1 | 11/2001 | Fan et al. | |
| 6,315,576 B1 | 11/2001 | Neidich | |
| 6,345,987 B1 | 2/2002 | Mori et al. | |
| 6,379,176 B1 | 4/2002 | Ohsawa et al. | |
| 6,384,475 B1 | 5/2002 | Beroz et al. | |
| 6,394,819 B1 | 5/2002 | Mosser, III et al. | |
| 6,409,521 B1 | 6/2002 | Rathburn | |
| 6,450,821 B1 | 9/2002 | Otsuki et al. | |
| 6,663,399 B1 | 12/2003 | Ali et al. | |
| 6,695,623 B1 | 2/2004 | Brodsky et al. | |

FOREIGN PATENT DOCUMENTS

| | | |
|---|---|---|
| EP | 0 310 302 A3 | 4/1989 |
| EP | 0 351 851 A2 | 1/1990 |
| EP | 0 351 851 A3 | 1/1990 |
| EP | 0 405 333 A2 | 1/1991 |
| EP | 0 405 333 A3 | 1/1991 |
| EP | 0 431 566 A1 | 6/1991 |
| EP | 0 574 793 A1 | 12/1993 |
| EP | 0571879 | 12/1993 |
| EP | 0310 302 B1 | 10/1994 |
| EP | 0 817 319 A2 | 1/1998 |
| EP | 0 817 319 A3 | 1/1998 |
| EP | 0574 793 B1 | 1/1999 |
| EP | 0 817 319 B1 | 9/2002 |
| GB | 1 488 328 | 10/1977 |
| GB | 2 027 560 | 2/1980 |
| GB | 2274212 | 7/1994 |
| WO | WO98/13695 | 4/1998 |
| WO | WO98/50985 A1 | 11/1998 |
| WO | WO 00/46885 A1 | 8/2000 |
| WO | WO 01/09980 A2 | 2/2001 |
| WO | WO 01/09980 A3 | 2/2001 |
| WO | WO 01/54232 A2 | 7/2001 |
| WO | WO 01/54232 A3 | 7/2001 |

* cited by examiner

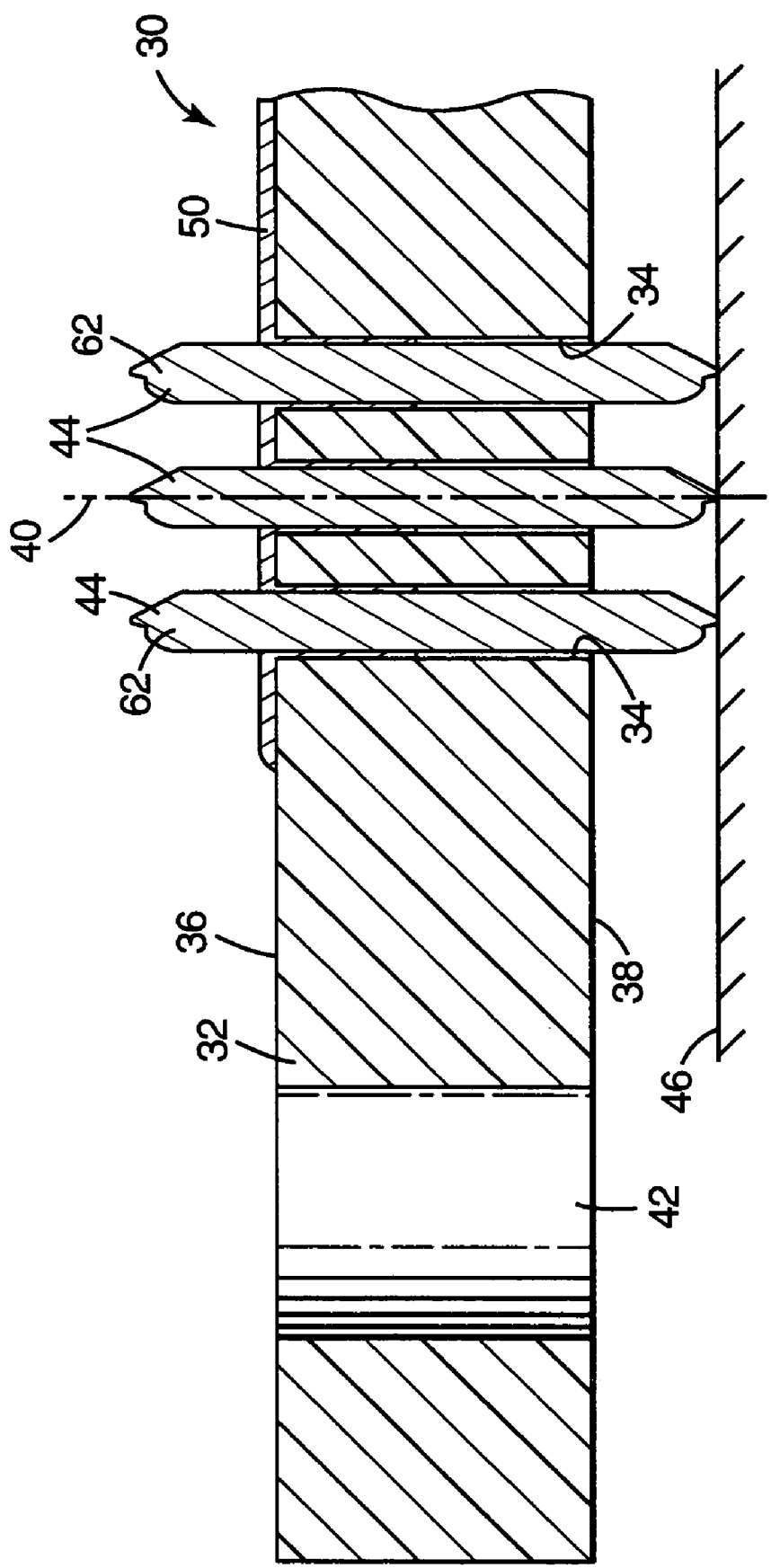

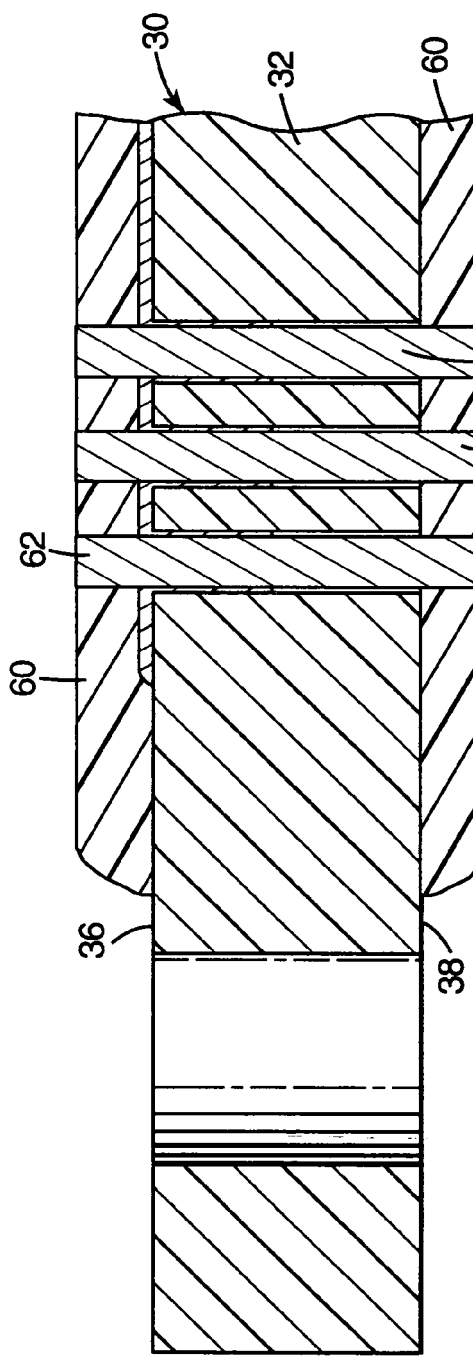
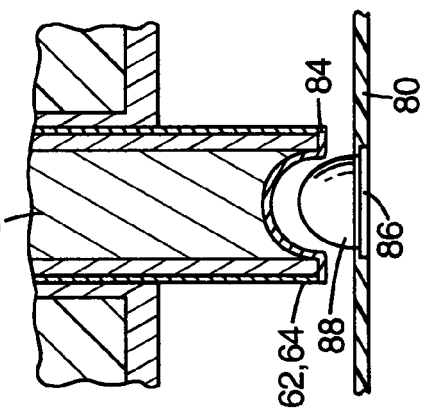
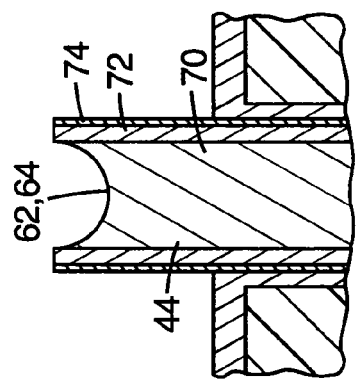
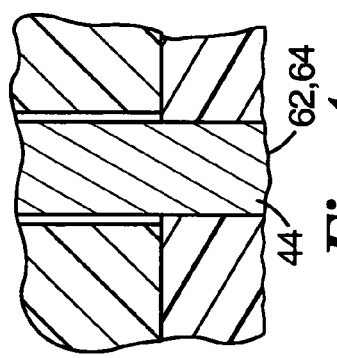

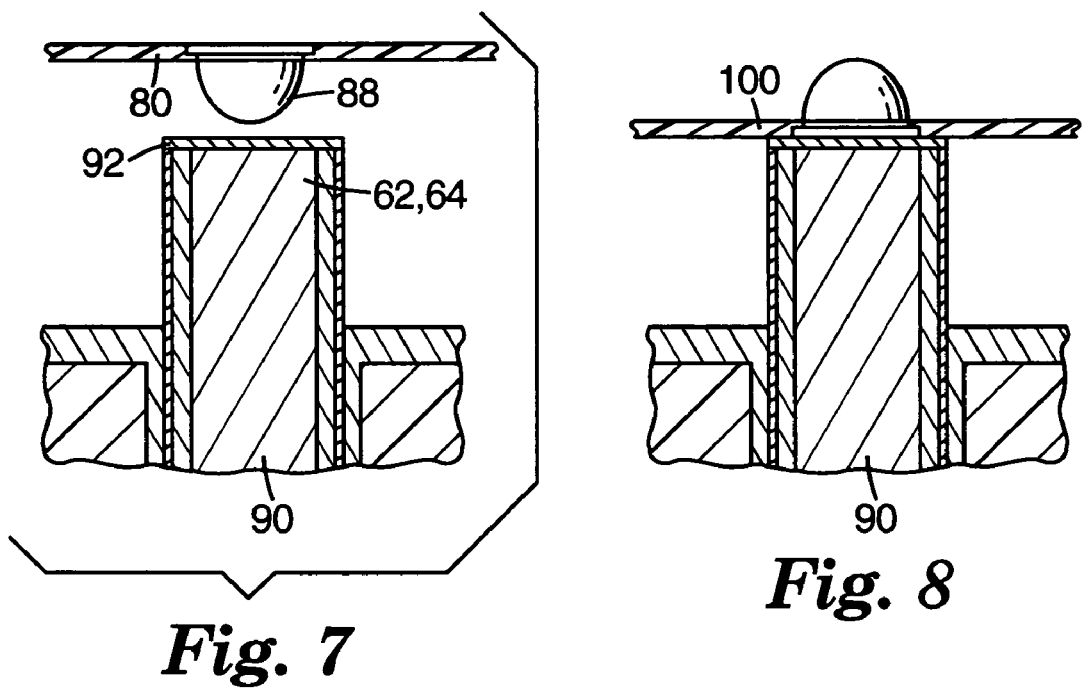
Fig. 7
Fig. 8
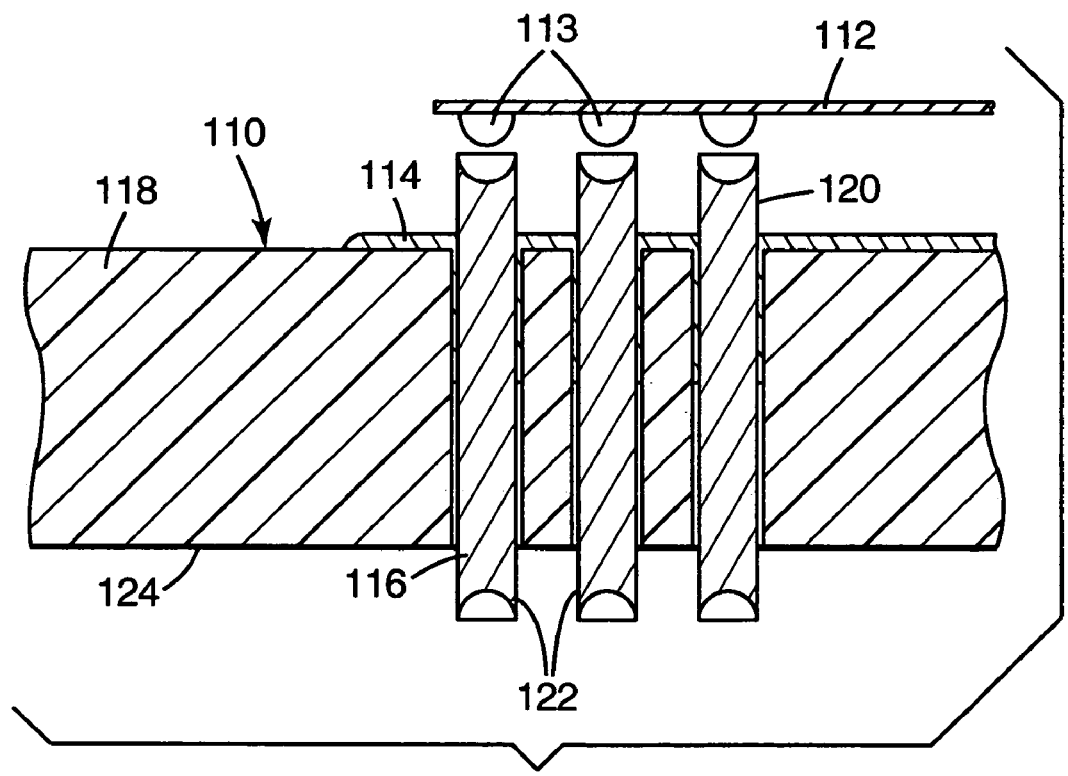
Fig. 9

CONTROLLED COMPLIANCE FINE PITCH ELECTRICAL INTERCONNECT

CLAIM OF PRIORITY

The present application is a Divisional of U.S. Ser. No. 10/031,422 filed Jan. 16, 2002, issued Dec. 14, 2004 as U.S. Pat. No. 6,830,460, entitled Controlled Fine Pitch Interconnect, which claims priority to PCT/US00/20748 filed Jul. 31, 2000, which claims the benefit of U.S. Provisional Application No. 60/146,825 filed Aug. 2, 1999.

FIELD OF THE INVENTION

The present invention is directed to a method and apparatus for achieving a very fine pitch, solderless interconnect between a flexible circuit member and another circuit member, and to an electrical interconnect assembly for forming a solderless interconnection with another circuit member.

BACKGROUND OF THE INVENTION

It is desirable to probe test each die or device under test (DUT) before the wafer is cut into individual integrated circuit die or before packaging. Die testing often needs to be performed at high speed or high frequency, for example 100 MHz data rate or higher. The probe cards that support a plurality of probe needles must provide reliable electrical contact with the bonding pads of the DUT. The shank of the probe needle is typically 0.005 inches to 0.010 inches in diameter.

One test probe technique is known as the Cobra system, in which the upper ends of the probe needles are guided through a rigid layer of an insulating material. The upper ends of the individual probe needles are electrically connected to suitable conductors of an interface assembly that is connected to an electrical test system. Each of the needles is curved and the lower ends pass through a corresponding clearance hole in a lower rigid layer or template of insulating material. The bottom ends of the needles contact the bonding pads on the wafer being tested. The length of the probe needles can result in undesirable levels of ground noise and power supply noise to the DUT. Additionally, the epoxy or plastic rigid layers have large coefficients of thermal expansion and cause errors in the positioning of the needle probes.

Another draw-back of current test probe technology is that it can often not accommodate fine pitches. For example, wafer probes typically require a target contact area of about 70 micrometers by 70 micrometers. Flip-chip architecture has terminals on the order of 10 micrometers by 10 micrometers, and hence, can not effectively be tested using wafer probe technology. Consequently, integrated circuits in flip-chip architectures can generally be tested only after packaging is completed. The inability to wafer probe integrated circuits used in flip-chip architecture results in production time delays, poor yields and a resultant higher cost.

Many of the problems encountered in testing electrical devices also occur in connecting integrated circuit devices to larger circuit assemblies, such as printed circuit boards or multi-chip modules. The current trend in connector design for those connectors utilized in the computer field is to provide both high density and high reliability connectors between various circuit devices. High reliability for such connections is essential due to potential system failure caused by misconnection of devices. Further, to assure effective repair, upgrade, testing and/or replacement of various components, such as connectors, cards, chips, boards, and modules, it is highly desirable that such connections be separable and reconnectable in the final product.

Pin-type connectors soldered into plated through holes or vias are among the most commonly used in the industry today. Pins on the connector body are inserted through plated holes or vias on a printed circuit board and soldered in place using conventional means. Another connector or a packaged semiconductor device is then inserted and retained by the connector body by mechanical interference or friction. The tin lead alloy solder and associated chemicals used throughout the process of soldering these connectors to the printed circuit board have come under increased scrutiny due to their environmental impact. Additionally, the plastic housings of these connectors undergo a significant amount of thermal activity during the soldering process, which stresses the component and threatens reliability.

The soldered contacts on the connector body are typically the means of supporting the device being interfaced by the connector and are subject to fatigue, stress deformation, solder bridging, and co-planarity errors, potentially causing premature failure or loss of continuity. In particular, as the mating connector or semiconductor device is inserted and removed from the present connector, the elastic limit on the contacts soldered to the circuit board may be exceeded causing a loss of continuity. These connectors are typically not reliable for more than a few insertions and removals of devices. These devices also have a relatively long electrical length that can degrade system performance, especially for high frequency or low power components. The pitch or separation between adjacent device leads that can be produced using these connectors is also limited due to the risk of shorting.

Another electrical interconnection method is known as wire bonding, which involves the mechanical or thermal compression of a soft metal wire, such as gold, from one circuit to another. Such bonding, however, does not lend itself readily to high-density connections because of possible wire breakage and accompanying mechanical difficulties in wire handling.

An alternate electrical interconnection technique involves placement of solder balls or the like between respective circuit elements. The solder is reflown to form the electrical interconnection. While this technique has proven successful in providing high-density interconnections for various structures, this technique does not facilitate separation and subsequent reconnection of the circuit members.

An elastomer having a plurality of conductive paths has also been used as an interconnection device. The conductive elements embedded in the elastomeric sheet provide an electrical connection between two opposing terminals brought into contact with the elastomeric sheet. The elastomeric material must be compressed to achieve and maintain an electrical connection, requiring a relatively high force per contact to achieve adequate electrical connection, exacerbating non-planarity between mating surfaces. Location of the conductive elements is generally not controllable. Elastomeric connectors may also exhibit a relatively high electrical resistance through the interconnection between the associated circuit elements. The interconnection with the circuit elements can be sensitive to dust, debris, oxidation, temperature fluctuations, vibration, and other environmental elements that may adversely affect the connection.

The problems associated with connector design are multiplied when multiple integrated circuit devices are packaged together in functional groups. The traditional way is to solder the components to a printed circuit board, flex circuit, or ceramic substrate in either a bare die silicon integrated circuit form or packaged form. Multi-chip modules, ball grids, array packaging, and chip scale packaging have evolved to allow multiple integrated circuit devices to be interconnected in a group.

One of the major issues regarding these technologies is the difficulty in soldering the components, while ensuring that reject conditions do not exist. Many of these devices rely on balls of solder attached to the underside of the integrated circuit device which is then reflown to connect with surface mount pads of the printed circuit board, flex circuit, or ceramic substrate. In some circumstances, these joints are generally not very reliable or easy to inspect for defects. The process to remove and repair a damaged or defective device is costly and many times results in unusable electronic components and damage to other components in the functional group.

Multi-chip modules have had slow acceptance in the industry due to the lack of large scale known good die for integrated circuits that have been tested and burned-in at the silicon level. These dies are then mounted to a substrate which interconnect several components. As the number of devices increases, the probability of failure increases dramatically. With the chance of one device failing in some way and effective means of repairing or replacing currently unavailable, yield rates have been low and the manufacturing costs high.

BRIEF SUMMARY OF THE INVENTION

The present invention is directed to a method and apparatus for achieving a very fine pitch interconnect between a flexible circuit member and another circuit member with extremely co-planar electrical contacts that have a large range of compliance. The second circuit member can be a printed circuit board, another flexible circuit, a bare-die device, an integrated circuit device, an organic or inorganic substrate, a rigid circuit and virtually any other type of electrical component.

The present invention is also directed to an electrical interconnect assembly comprising a flexible circuit member electrically coupled to an electrical connector in accordance with the present invention. The present electrical interconnect assembly can be used as a die-level test probe, a wafer probe, a printed circuit probe, a connector for a packaged or unpackaged circuit device, a conventional connector, a semiconductor socket, and the like.

In one embodiment, the electrical interconnect assembly includes a flexible circuit member having a first surface with terminals and a second surface. The first housing has a plurality of through holes extending between a first surface and a second surface. A plurality of electrical contact members are positioned in at least a portion of the through holes. The electrical contact members have first ends electrically coupled with the terminals on the flexible circuit member and second ends adapted to electrically couple with a second circuit member. A compliant material is positioned along the second surface of the flexible circuit member opposite at least one of the terminals to bias the second ends of the electrical contact member against the second circuit member.

In one embodiment, the first ends of the electrical contact members are fixedly bonded to the terminals on the flexible circuit member. The electrical contact members can be electrically coupled to the flex circuit using one or more of a compressive force, solder, a wedge bond, a conductive adhesive, an ultrasonic bond and a wire bond. In one embodiment, the compliant material is a sheet material. The compliant material can be continuous or discontinuous. The second surface of the housing optionally includes at least one device site adapted to receive the second circuit member.

At least one of the terminals on the flexible circuit member is preferably a singulated terminal. A portion of the flexible circuit member is preferably bonded to the first surface of the housing.

The second ends of the electrical contact members preferably have a shape that corresponds to a shape of the terminals on the second circuit member. The second ends of the electrical contact members are preferably capable of engaging with a contact on the second circuit member selected from the group consisting of a flexible circuit, a ribbon connector, a cable, a printed circuit board, a ball grid array (BGA), a land grid array (LGA), a plastic leaded chip carrier (PLCC), a pin grid array (PGA), a small outline integrated circuit (SOIC), a dual in-line package (DIP), a quad flat package (QFP), a leadless chip carrier (LCC), a chip scale package (CSP), or packaged or unpackaged integrated circuits.

The electrical contact members can be a homogeneous material or a multi-layered construction. The electrical contact members can optionally have a cross-sectional shape selected from one of circular, oval, polygonal, and rectangular. The electrical contact members optionally have at least one feature that limits movement in the first housing toward the second circuit member. In one embodiment, the electrical contact members have a larger cross section proximate the first end than at the second end. The electrical contact members preferably have a pitch of less than about 0.4 millimeters, and more preferably a pitch of less than about 0.2 millimeters. The plurality of through holes are optionally arranged in a two-dimensional array.

In one embodiment, the second ends of the electrical contact members comprises one or more of die level test probe, a wafer probe, and printed circuit board probe. In another embodiment, a plurality of the present electrical interconnect assemblies are located in a plurality of the recesses in a module so that the second ends of the electrical contact members comprise test probes. In one embodiment, the second circuit member is a wafer having a plurality of electrical devices. The recesses are preferably arranged in a two-dimensional array corresponding to a two-dimensional array of electrical devices on the second circuit member.

The present invention is also directed to a second housing having a plurality of through holes extending between a first surface and a second surface. A plurality of electrical contact members are positioned in at least a portion of the through holes. The electrical contact members have first ends electrically coupled with the terminals on the flexible circuit member and second ends adapted to electrically couple with a third circuit member. In one embodiment, the first surface of the first housing is positioned opposite the first surface of the second housing. In another embodiment, the first housing and the second housing are arranged in a stacked configuration.

The present invention is also directed to a method of making an electrical interconnect assembly. A first surface of a flexible circuit member is positioned against a first surface of a housing. The housing has a plurality of through holes extending between the first surface of the housing and a second surface of the housing. A plurality of terminals on the first surface of the flexible circuit member are aligned with a plurality of the through holes. A plurality of electrical contact members are positioned in at least some of the through holes. The electrical contact members have first ends electrically coupled with the terminals on the flexible circuit member, and second ends adapted to electrically couple with a second circuit member. A compliant material is positioned along a second surface of the flexible circuit member opposite at least one of the terminals to bias the second ends of the electrical contact member against the second circuit member.

BRIEF DESCRIPTION OF THE SEVERAL VIEWS OF THE DRAWING

FIG. 1 is a side sectional view of an electrical interconnect in accordance with the present invention.

FIG. 3 is a side sectional view of a method of modifying the electrical interconnect of FIG. 2.

FIG. 4 is a side sectional view of an electrical contact modified in accordance with the method of the present invention.

FIG. 5 is a side sectional view of an electrical contact modified in accordance with an alternate method of the present invention.

FIG. 6 is a side sectional view of an electrical contact bonded to a flexible circuit in accordance with the present invention.

FIG. 7 is a side sectional view of an alternate method of bonding the flexible circuit to the electrical contact in accordance with the present invention.

FIG. 8 is a side sectional view of an alternate method of bonding the flexible circuit to the electrical contact in accordance with the present invention.

FIG. 9 is a side sectional view of an electrical interconnect bonded to a flexible circuit in accordance with the present invention.

DETAILED DESCRIPTION OF THE INVENTION

Figure 1A:
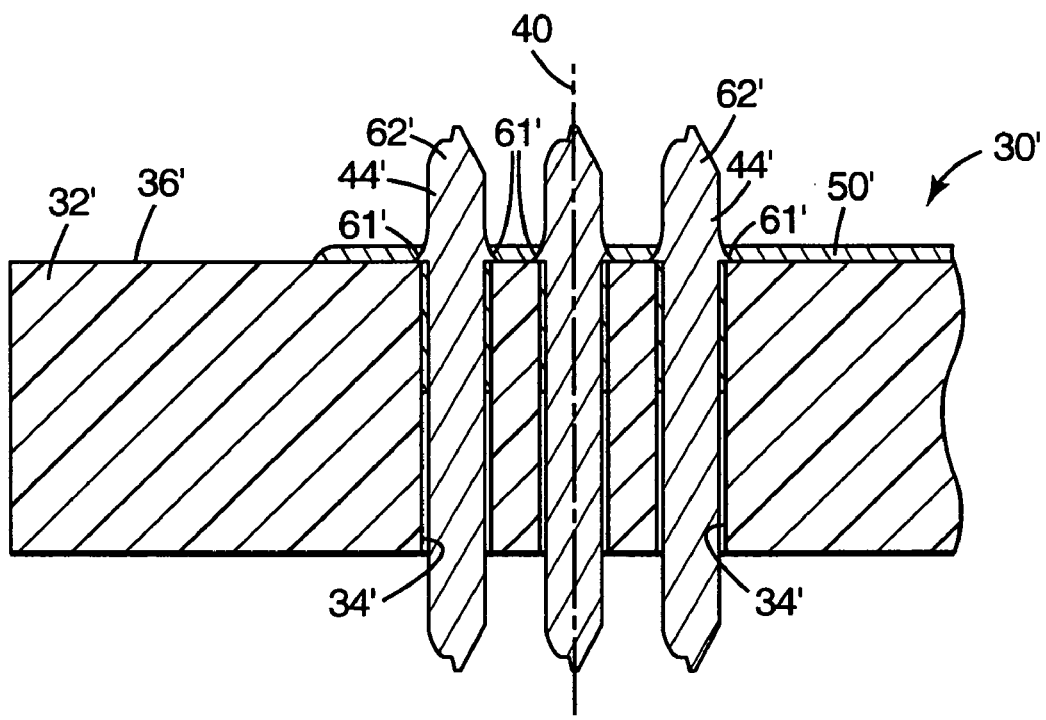
FIG. 1A is a side sectional view of an alternate electrical interconnect in accordance with the present invention.

FIG. 1 is a side sectional view illustrating a step in the method of making an electrical interconnect 30 in accordance with the present invention. Housing 32 has a plurality of through holes 34 that extend from a first surface 36 to a second surface 38. Each of the holes 34 defines a central axis 40. Housing or interposer 32 may be constructed from a dielectric material, such as plastic, ceramic, metal with a non-conductive coating. The holes can be formed by a variety of techniques, such as molding, laser drilling, or mechanical drilling. The holes 34 can be arranged in a variety of configuration, including one or two-dimensional arrays. The housing 32 may optionally include a tooling hole 42 to facilitate handling and alignment with other components.

A plurality of rigid or semi-rigid electrical contacts 44 are positioned in some or all of the holes 34. The electrical contacts 44 may be positioned in the holes 34 by a variety of techniques, such as manual assembly, vibratory assembly, or robotic assembly. In the illustrated embodiment, the electrical contacts 44 are maintained in their desired location by a height fixture 46. Upper ends 62 of the electrical contacts 44 may exhibit height differences based upon the manufacturing tolerances and constancy of the manufacturing process.

The electrical contacts may be a variety of materials, such as wire, rod, formed strips, or turned or machined members. The electrical contacts can have a cross-sectional shape that is circular, oval, polygonal, or the like. The electrical contacts can be made from a variety of materials, such as gold, copper, copper alloy, palanae, or nickel. The electrical contacts 44 are typically cut or formed into a general length, which reduces cost and handling difficulties. The electrical contacts are modified during subsequent processing steps to achieve the necessary precision, such as planarity and tip shape. In order to achieve a fine pitch without shorting, the electrical contact must typically be straight to within about 0.25 millimeters and be rigid or semi-rigid in construction. The electrical contacts 44, however, may have a different cross section at various locations along their entire length (see FIG. 1A).

In the embodiment illustrated in FIG. 1, a compliant encapsulating material 50 is applied to the first surface 36. The compliant encapsulating material 50 surrounds the electrical contacts 44 and bonds to the first surface 36. In the illustrated embodiment, the complaint encapsulating material penetrates at least part way into the holes 34. In an alternate embodiment, the encapsulating material 50 remains generally on the surface 36. The compliant encapsulating material 50 permits the electrical contacts 44 to move elastically along the central axis 40, while retaining them in the housing 32. Suitable compliant encapsulating materials include Sylgard® available from Dow Corning Silicone of Midland, Mich., and MasterSyl 713, available from Master Bond Silicone of Hackensack, N.J.

Figure 2:
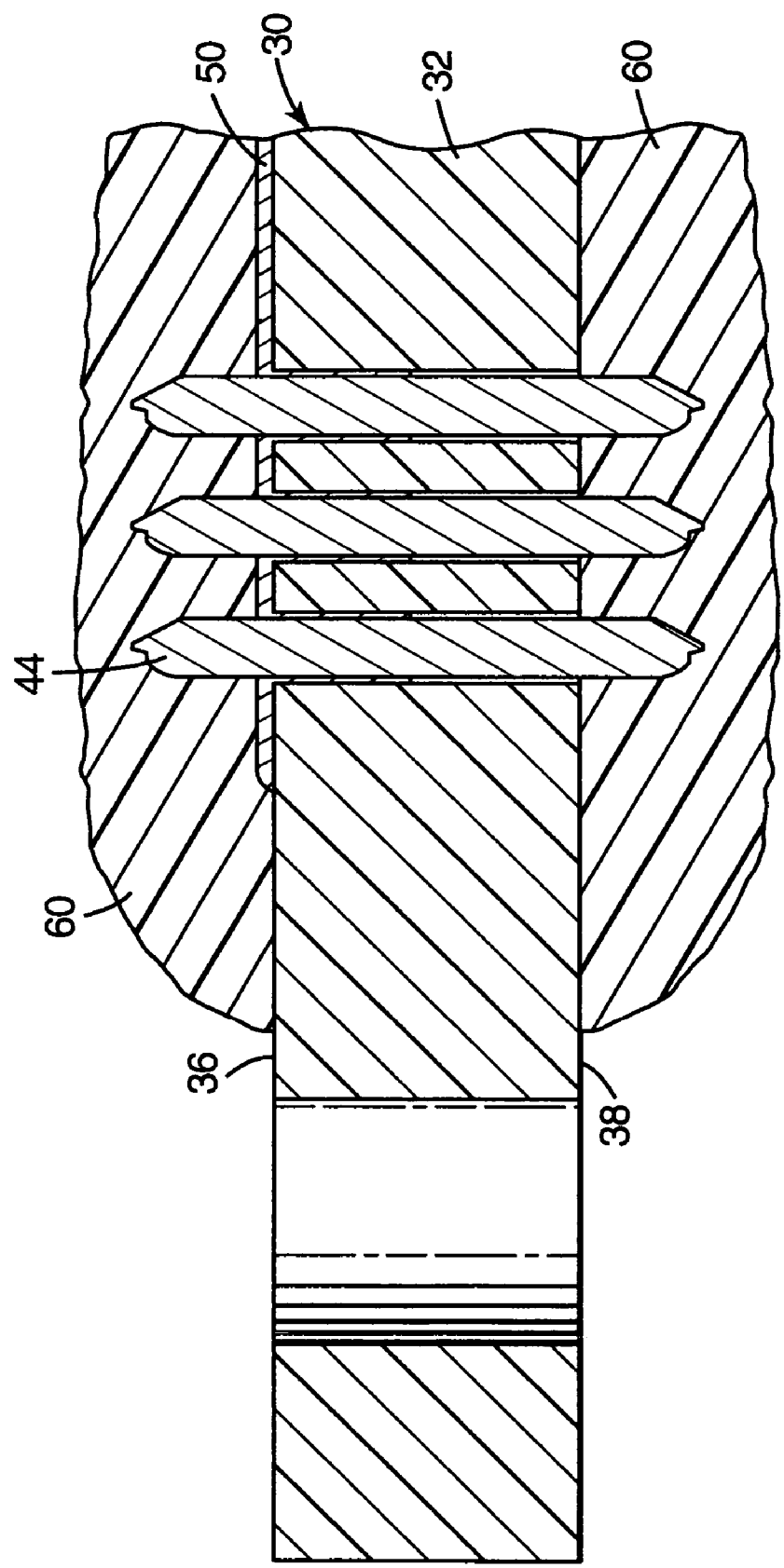
FIG. 2 is a side sectional view of a method of modifying the electrical interconnect of FIG. 1.

FIG. 2 illustrates another step in the method of forming the electrical interconnect 30 in accordance with the present invention. The first surface 36 and/or the second surface 38 are flooded with one or more retention materials 60 that will assist in the further processing steps. The retention material 60 can be a compliant encapsulant or a material that cures solid, such as a solder mask. Once the retention material 60 has cured, the electrical contacts 44 are rigidly held to the housing 32 so that the fixture 46 can be removed. The material retention 60 can optionally be applied to the second surface 38. In an alternate embodiment, the compliant encapsulating material 50 is omitted and the retention material 60 is applied directly to the first surface 36.

FIG. 3 is a side sectional view showing a subsequent step in the processing of the electrical interconnect 30 in accordance with the present invention. The retention material 60 retains the electrical contacts 44 in the housing 32 so that ends 62, 64 can be processed without flexural displacement or damage. The assembly is subjected to a precision grinding operation, which results in very flat ends 62, 64 on the electrical contacts 44, typically within about 0.0005 inches. The grinding operation can be performed on both sides at the same time using a lapping or double grinding process. In an alternate embodiment, only one surface 36, 38 of the electrical interconnect 30 is subject to the planarization operation. The retention material 60 is then dissolved from the electrical interconnect 30 to expose the first and second ends 62, 64, of the electrical contacts 44 (see FIG. 9). In an alternate embodiment, the first and/or second ends 62, 64 of the electrical contacts are subject to further processing prior to removal of the material 60.

FIG. 1A illustrates an alternate embodiment method of making an electrical interconnect 30' in accordance with the present invention. Upper ends 62' of the electrical contacts 44' have a cross sectional portion 61' that is larger than the cross sectional area of the holes 34' that engages with the first surface 36'. Consequently, the electrical contacts 44' are always oriented in the same direction in the housing 32', even when positioned using automated processes such as vibratory assembly. The cross sectional portion 61' also makes the fixture 46 of FIG. 1 unnecessary. The electrical interconnect 30' may subsequently processed as discussed herein, such as application of a compliant encapsulating material 50'. Alternatively, the upper ends 62' can be deformed during a subsequent processing step.

Figure 1B:
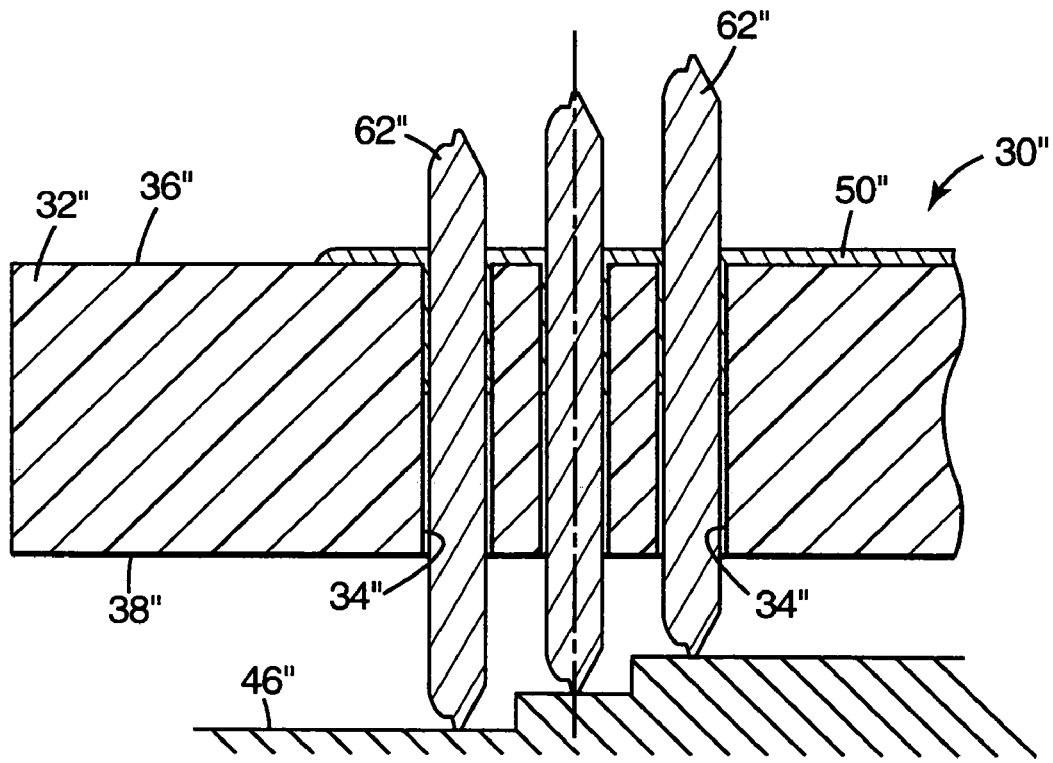
FIG. 1B is a side sectional view of another alternate electrical interconnect in accordance with the present invention.

FIG. 1B illustrates another alternate embodiment method of making an electrical interconnect 30" in accordance with the present invention. In the illustrated embodiment the electrical contacts 44" are generally of the same length. Fixture 46" has support surfaces at various levels relative to second surface 38" of housing 32". Consequently, the electrical contacts 44" are maintained in the holes 34" in a step configuration. The electrical interconnect 30" may be subsequently processed as discussed herein, such as application of a compliant encapsulating material 50". In one embodiment, a retention material 60 (see FIG. 2) is applied to the first surface 36". The ends 62" of the electrical contacts 44" are planarized, such as is illustrated in FIG. 3. The ends 64" extending beyond the surface 38", however, are not planarized and retain the step configuration.

Depending on the material of the electrical contacts 44 and the desired function, the planar ends 62, 64 may exhibit different properties. If the electrical contacts are made of a copper base metal or alloy and plated with a barrier layer and a gold layer, the grinding process will remove the nickel and gold from the tips, exposing base metal that will oxidize. If the electrical contact 44 is a material such as gold or palanae, corrosion is minimized. The ends 62, 64 can be tailored for specific applications, such that the first end 62 may have a different structure or shape than the second end 64.

Depending on the type of terminal the electrical contact 44 is intended to interface with, it may be desirable to abrasively process the tips such that the ends 62, 64 are still essentially planar but have a surface which is more irregular than that left by the grinding process. This abrasive processing can also be of a cleaning nature to remove any oxides formed between process steps. FIG. 4 illustrates one embodiment of an ends 62, 64 of an electrical contact 44 that has been subject to an abrasive blast operation to provide a correspondingly rough surface.

FIG. 5 illustrates an alternate ends 62, 64 of an electrical contact 44 that has been subject to an etching process. In the illustrated embodiment, the electrical contact 44 is constructed from a copper alloy core 70, an intermediate nickel layer 72 and an outer gold layer 74. When subjected to an etching solution, only the copper alloy 70 is removed. In the illustrated embodiment, the ends 62, 64 has a generally concave tip shape, where the outer walls 72, 74 extend beyond the post-processed base metal 70. The ends 62, 64 can then be processed to deposit another barrier to prevent contamination by oxides, such as a gold layer (see FIG. 6). In some instances, it may be acceptable to leave the base metal 70 untreated.

The generally concave shape of the ends 62, 64 can provide several desired functional properties, such as contacting a solder, gold, or other deposits in a generally mating fashion, without excessively deforming the deposits. Additionally, the protruding outer wall 72, 74 provides a slight wiping action during mating with the corresponding component. The outer walls 72, 74 form a tubular structure that increases the pressure per unit area when compressively engaged with a mating electrical circuit member. Finally, the concave shape of the ends 62, 64 provides a reservoir for contamination on the terminal of the mating circuit member, while the relatively hard outer layer 72, 74 minimize deformation of the tip 62, 64. The etching process may be performed either before or after removal of the material 60.

FIG. 6 is a side sectional view of a flexible circuit member 80 being bonded to a electrical contact 82 in accordance with the present invention. The electrical contact 82 includes a barrier layer 84 along the ends 62, 64. In the illustrated embodiment, the terminals 86 on the flexible circuit member 80 include a ball structure 88 having a shape corresponding to the ends 62, 64 of the electrical contact 82. The ball structure 88 can be constructed from gold, solder, or a conductive adhesive. The ball structure 88 is aligned to each corresponding electrical contact ends 62, 64 and ultrasonically bonded. Alternatively, the ball structure 88 can be a solder ball or deposit, which can then be reflown to attach each electrical contact member 82. Several iso-tropic and anisotropic conductive adhesives are available to achieve similar results. In another embodiment, the ball structure 88 can be electrically coupled to the ends 62, 64 by a compressive force.

FIG. 7 is a side sectional view of an alternate electrical contact 90 in accordance with the present invention. A barrier layer 92, such as gold, is deposited on the generally planar ends 62, 64 of the electrical contact 90. The ball structure 88 of the flexible circuit member 80 is then bonded to the barrier layer 92. FIG. 8 is a side sectional view of a high density, flexible circuit member 100 being bonded to the electrical contact 90 using a wire bonding technique.

FIG. 9 is a side sectional view of an electrical interconnect 110 electrically coupled to bonding pads 113 on a flexible circuit member 112 in accordance with the present invention. In the illustrated embodiment, the resilient encapsulating material 114 retains the electrical contacts 116 within the housing 118, but permits movement along the central axes. The first ends 120 of the electrical contacts 116 may be electrically coupled with the flexible circuit 112 using a variety of techniques discussed herein, such as applying a compressive force, solder, wedge bonding, conductive adhesives, ultrasonic bonding and wire bonding. The second ends 122 of the electrical contacts 116 extend beyond the second surface 124 of the housing 118 to couple electrically with a second circuit member (see FIG. 16).

Figure 9A:
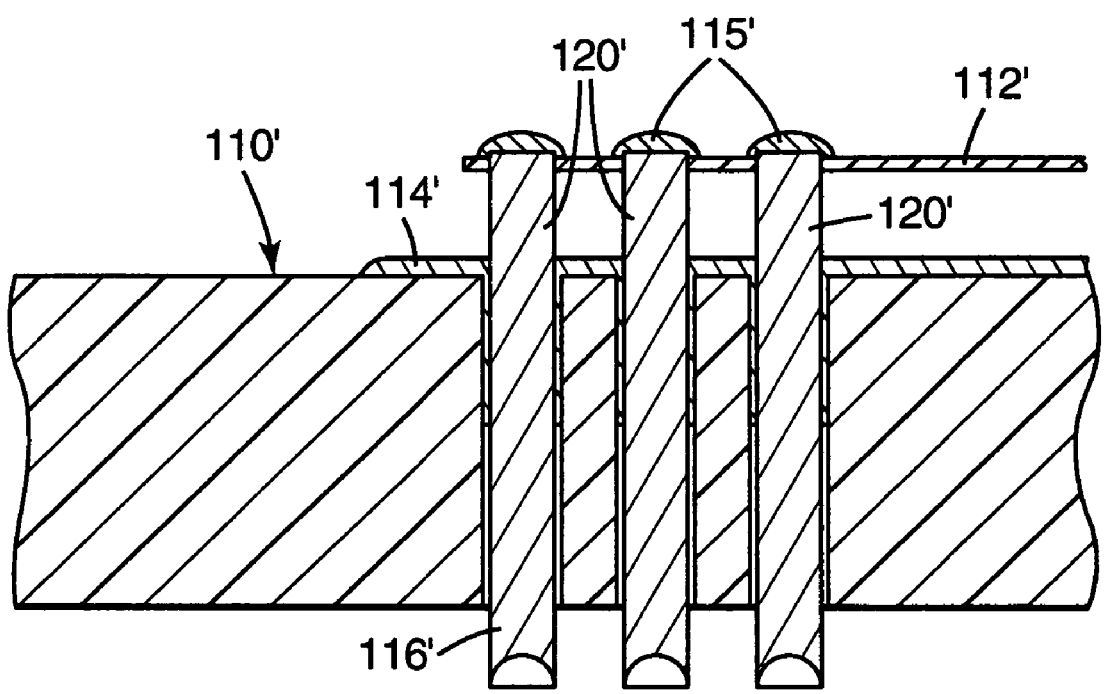
FIG. 9A is a side sectional view of an alternate electrical interconnect bonded to a flexible circuit in accordance with the present invention.

FIG. 9A illustrates an alternate embodiment of an electrical interconnect 110' electrically coupled a flexible circuit member 112' in accordance with the present invention. The flexible circuit member 112' has a series of pass through openings. The flexible circuit member 112' is aligned to the electrical contacts 116' such that the pass though openings are located directly on each electrical contact end 120' in the array. A gold ball bonder can then be used to bond the flexible circuit member 112' to the ends 120' of the electrical contacts 116', where the gold balls 115' extend to an exposed conductive layer in the flexible circuit member 112'.

Once the flexible circuit member 112 is attached, several options can be employed to increase the function of the electrical interconnect 110. These features, discussed in detail below, provide a relatively large range of compliance of the electrical contacts 116, complimented by the extreme co-planarity of the electrical contact ends 122. The nature of the flexible circuit 112 allows fine pitch interconnect and signal escape routing, but also inherently provides a mechanism for compliance. One option is to allow the flexing nature of the flexible circuit member 112 to provide compliance as the lower ends 122 are compressed. The semi-rigid or rigid nature of the electrical contacts 116 will transmit the incident force to the flexible circuit member 112 and cause flexure at the area around the bond sites 113. The flexible circuit member 112 can be left separate from the housing 118 to allow a free range of movement or the flexible circuit 112 can be selectively bonded to the housing 118 to restrict movement if desired.

Figure 10:
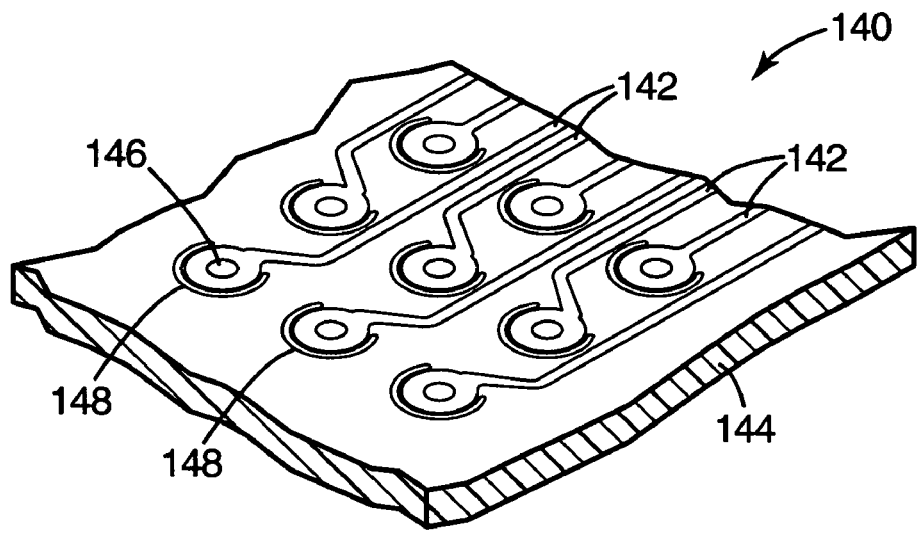
FIG. 10 is a perspective view of an flexible circuit member in accordance with the present invention.

FIG. 10 is a perspective view of a flexible circuit member 140 in accordance with the present invention. The flexible circuit member 140 includes a series of electrical traces 142 deposited on a polymeric sheet 144 and terminating at a plurality of terminals or terminals 146. As used herein terminal refers to an electrical contact location or contact pad. In the illustrated embodiment, the terminals 146 include a singulation 148. Singulation refers to a partial separation of the terminal from the sheet that does not disrupt the electrical integrity of the conductive trace. The partial separation can be a perforation in the polymeric sheet 144. Alternatively, singulation may include a thinning or point of weakness of the sheet material along the edge of, or directly behind, the terminal. In the illustrated embodiment, singulating the flexible circuit member 140 near or around the terminals 146 releases or separates the terminal from the sheeting 144, while maintaining the interconnecting circuit traces 142. The singulations can be formed at the time of manufacture or the sheeting 144 can be subsequently patterned by stamping, cutting or a variety of other techniques. In one embodiment, a laser system, such as Excimer, CO2, or YAG, creates the singulation 148. This structure is advantageous in several ways, where the force of movement is greatly reduced since the flexible circuit member 140 is no longer a continuous membrane, but a series of flaps or bond sites with a living hinge and bonded contact.

In the illustrated embodiment, the singulation 148 is a slit surrounding a portion of the terminal 146. The slit may be located adjacent to the perimeter of the terminal 146 or offset therefrom. The singulation 148 may be formed to serve as the resilient member for controlling movement of the electrical contacts along their respective central axes. The singulated terminal 146 can be left free from the housing or it can be selectively bonded such that the hinged portion is allowed to move freely within a given range. The singulated flexible circuit member 140 can also be encapsulated or mated with a compliant sheet to control the amount of force, the range of motion, or assist with creating a more evenly distributed force vs. deflection profile across the array (see FIG. 11).

Figure 11:
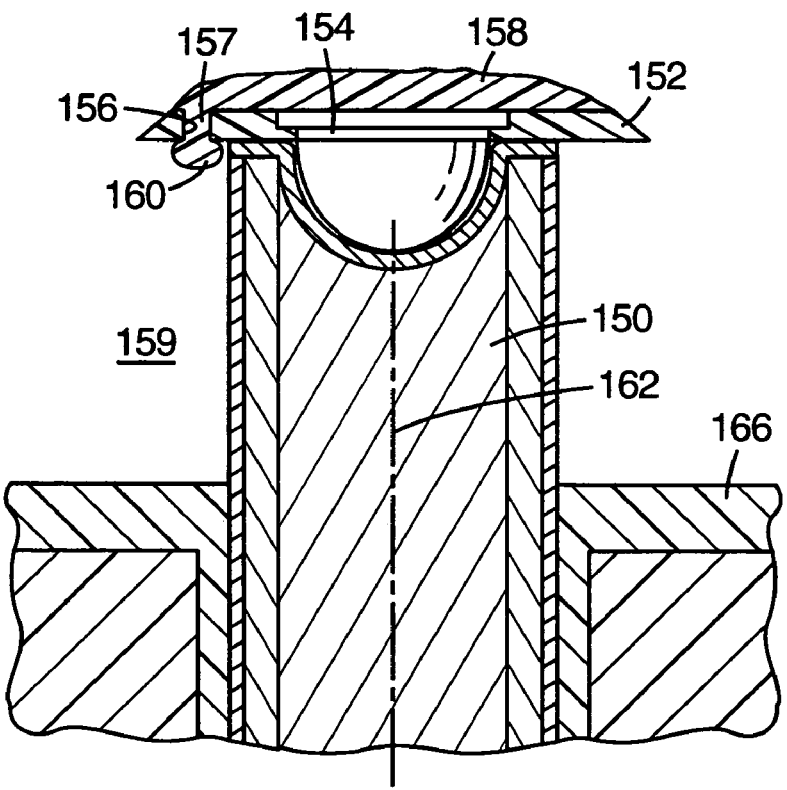
FIG. 11 is a side sectional view of a singulated flexible circuit in accordance with the present invention.

FIG. 11 is a side sectional view of an electrical contact 150 electrically coupled to a flexible circuit member 152. The terminal 154 of the flexible circuit member 152 has been singulated at a location 156. A compliant encapsulating material 158 has been deposited on the surface of the flexible circuit member 152 opposite the electrical contact 150. Alternatively, the flexible circuit member 152 can be mated with a compliant sheet of material to provide controlled force and compliance. The additional layer of compliant encapsulant or sheeting can also be precision ground to provide uniform thickness and compliance across the array. In the illustrated embodiment, movement of the electrical contact 150 along the central axis 162 is controlled by the compliant encapsulant 166 deposited around the electrical contact 150, the resiliency of the flexible circuit member 152, and the resiliency of the compliant encapsulant 158. These components are engineered to provide a desired level of compliance to the electrical contact 150 within the housing 166.

In the illustrated embodiment, a portion of the compliant encapsulating material 160 has seeped through the singulation 156. The liquid nature of the uncured encapsulant can be taken advantage of by applying or injecting it into the singulation gap 157 under a slight vacuum condition in the region 159 between the flexible circuit member 152 and the encapsulant 166. The material 158 is drawn into the singulation gap 157. The encapsulated gap 157 supports and controls the motion of the terminal 154. This control can minimize the flexural stress and fatigue of the singulated terminal 154, increasing mechanical performance and life. In an alternate embodiment, the compliant sheet or encapsulant 158 can be applied prior to singulation of the flexible circuit member 152, such that the living hinge mechanism is a laminate or composite of the compliant encapsulant 158 and the flexible circuit member 152.

Figure 11A:
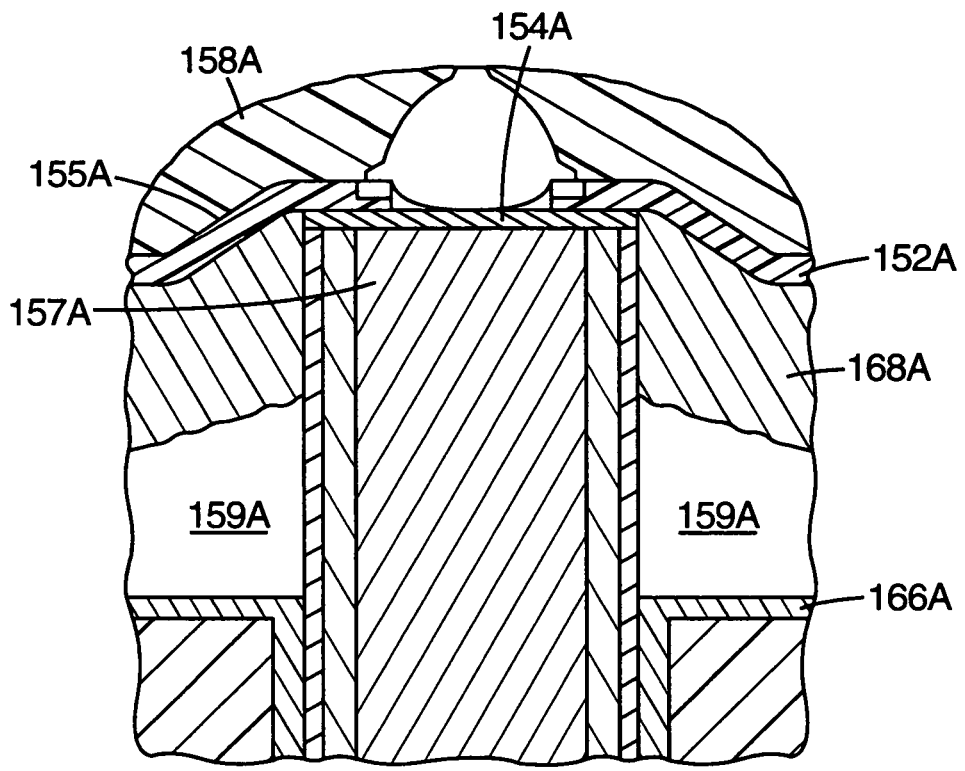
FIG. 11A is a non-singulated flexible circuit in accordance with the present invention.

FIG. 11A is a side sectional view of an electrical contact 150A electrically coupled to a flexible circuit member 152A, without singulation of the terminals 154A. A vacuum is applied in the region 159A between the flexible circuit member 152A and the encapsulant 166A prior to applying the complaint encapsulating material 168A. The vacuum draws the flexible circuit member 152A down at the bond sites 154A and forms a dimple 155A over the first end 157A of the electrical contact 150A. Application of the complaint encapsulant 168A fills the dimples 155A, and when the vacuum is removed, the flexible circuit member 152A will have a different shape and a preload caused by the material 168A in the dimple 155A biasing the electrical contact 150A downward. A layer of compliant material 158A may optionally be applied to the outer surface of the flexible circuit member 152A.

Figure 12:
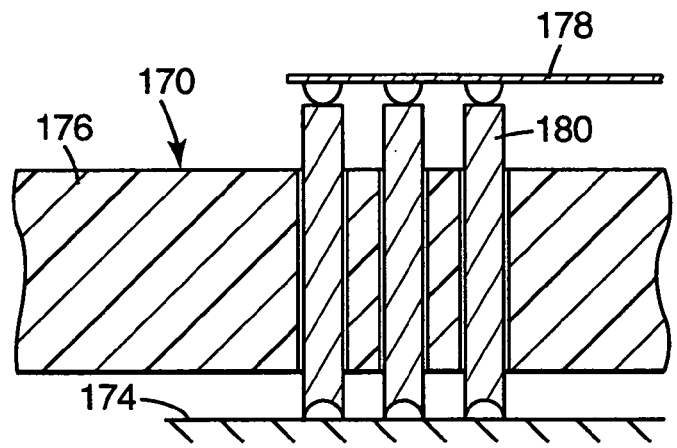
FIG. 12 is side sectional view of an alternate electrical interconnect bonded to a flexible circuit member in accordance with the present invention.

FIG. 12 is a side sectional view of an alternate electrical interconnect 170 in accordance with the present invention. The electrical contacts 172 have been prepared using the techniques discussed above, but no compliant encapsulating material was applied. Height fixture 174 retains the electrical contacts 172 at the desired position within the housing 176. A flexible circuit member 178 is bonded to the first ends 180 of the electrical contacts 172, using any of the techniques discussed above. Once the electrical contacts 172 are bonded to the flexible circuit member 178, the fixture 174 can be removed. The electrical contacts 172 are then suspended within the housing 176 by the flexible circuit member 178. Compliance is provided by the resiliency of the flexible circuit member 178. In one embodiment, the flexible circuit member is bonded to the housing 176. Other compliant members may optionally be added to the electrical interconnect 170.

Figure 13:
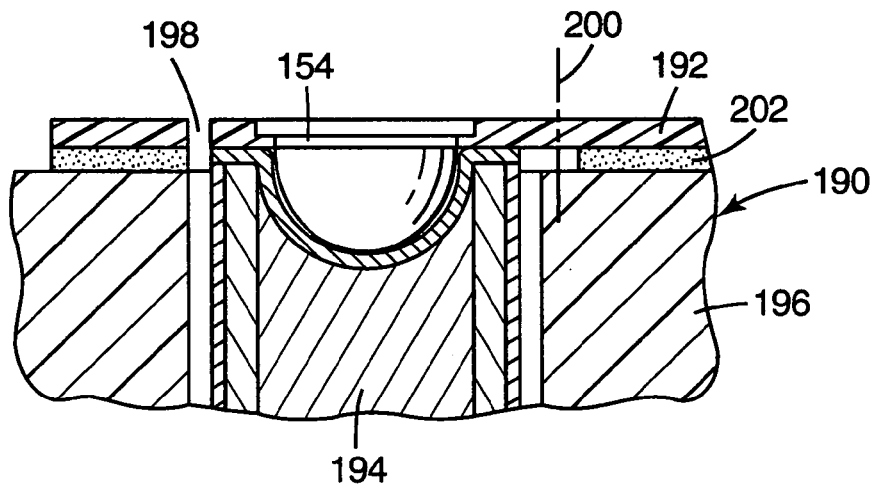
FIG. 13 is a side sectional view of a flexible circuit bonded to an electrical interconnect in accordance with the present invention.

FIG. 13 is a side sectional view showing one embodiment of an electrical interconnect 190 in an disengaged configuration. The flexible circuit member 192 is bonded to the electrical contact 194 as discussed herein. No encapsulating material is provided between the electrical contact 194 and housing 196. The electrical contact is suspended in the housing 196 by the flexible circuit member 192. The flexible circuit member 192 is optionally bonded to housing 196 with an adhesive layer 202. The flexible circuit member 192 is optionally singulated at the location 198 to provide a flexure point 200.

Figure 14:
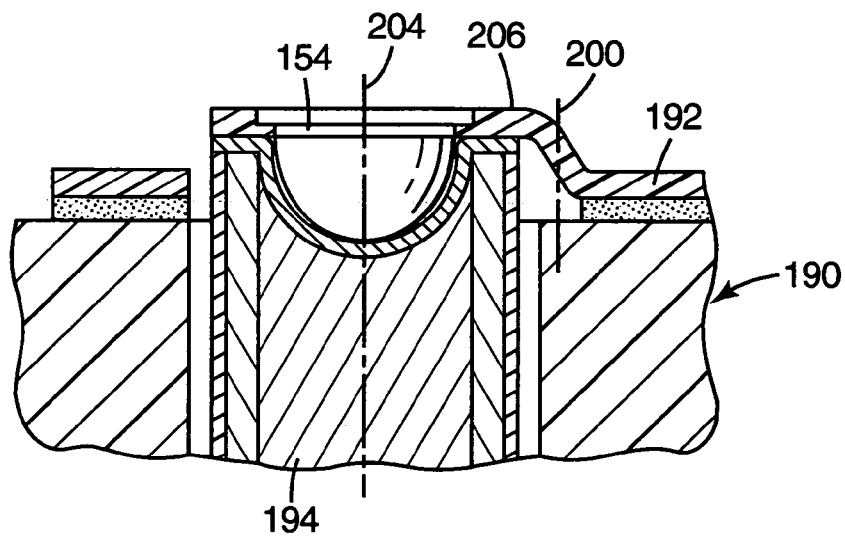
FIG. 14 is a side sectional view of the electrical interconnect of FIG. 13 in an engaged state.

FIG. 14 is a side sectional view of the electrical interconnect 190 of FIG. 13 in an engaged configuration. The electrical contact 194 has been displaced in the direction 204, causing the flexible circuit member 192 to flex at the flexure point 200. In the embodiment illustrated in FIGS. 13 and 14, the sole resilient member is the flexible circuit 192. In alternate embodiments, a compliant encapsulating material may be positioned along the rear surface 206 of the flexible circuit member 192 (see FIGS. 11A, 11B and 15).

Figure 15A:
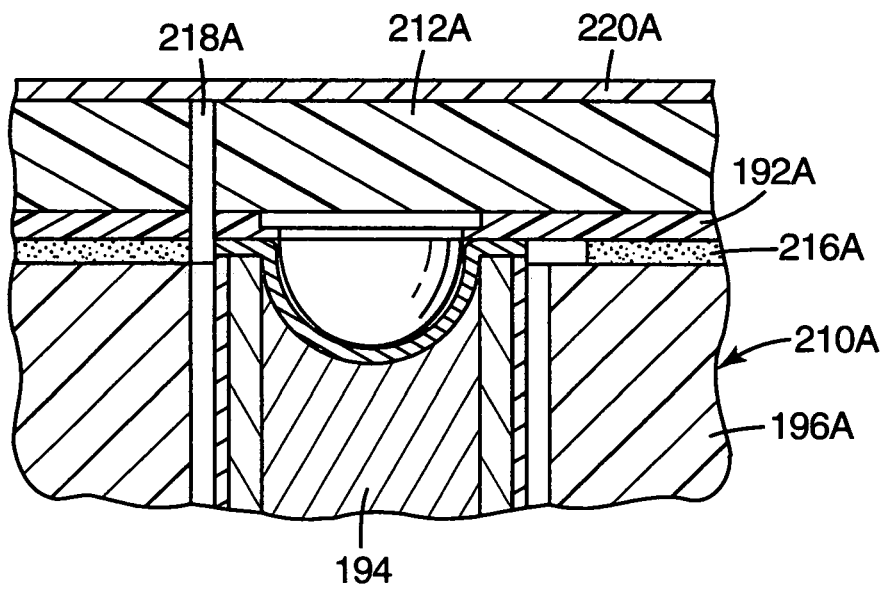
FIG. 15A is side sectional view of an alternate electrical interconnect in which the flexible circuit and encapsulating material are singulated in accordance with the present invention.
Figure 15:
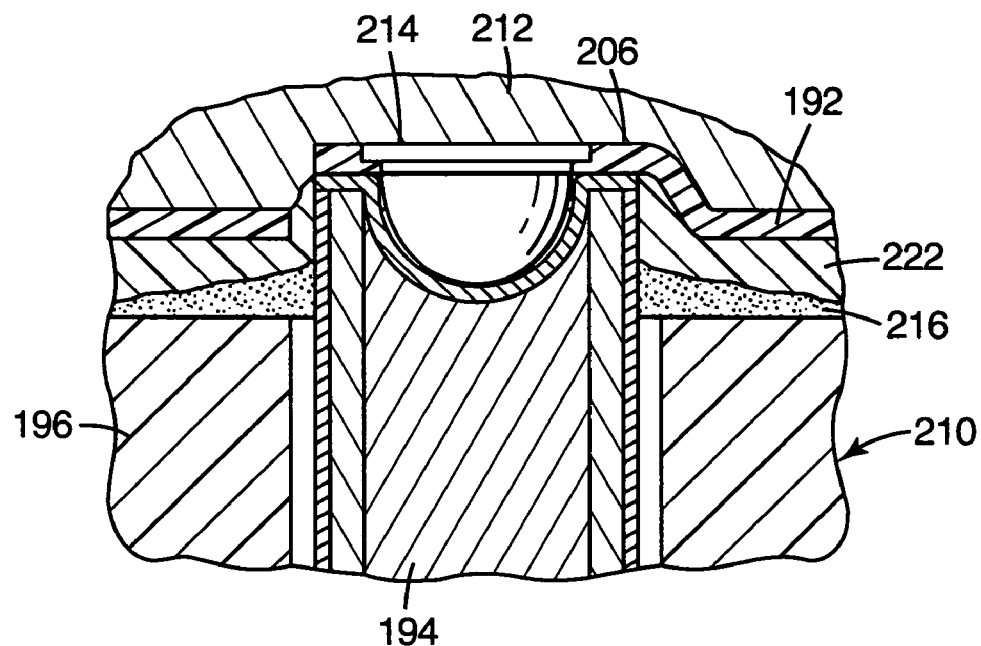
FIG. 15 is a side sectional view of an alternate electrical interconnect bonded to a singulated flexible circuit in accordance with the present invention.

FIG. 15 is a side sectional view of an electrical interconnect 210 in which the resiliency of a singulated, flexible circuit member 192 is supplemented by a compliant encapsulating material 212 positioned along the rear surface 214 of the flexible circuit 192 and a compliant encapsulating material 222 deposited between the flexible circuit 192 and the housing 196. The compliant encapsulating material 212 may be deposited as a liquid or positioned in sheet form, as discussed above. An adhesive layer 216 may optionally be provided for retaining the flexible circuit member 192 to the housing 196.

FIG. 15A is a side sectional view of an electrical interconnect 210A in which both the flexible circuit member 192A and the compliant encapsulating material 212A are singulated at a location 218A. The compliant encapsulating material 212A may be deposited in liquid form or positioned as a sheet form, as discussed above. An adhesive layer 216A may optionally be provided for retaining the flexible circuit member 192A to the housing 196A. The flexible circuit member 192A may be singulated prior to application of the encapsulating material 212A, or simultaneously therewith. A back-up member 220A may optionally be located behind the compliant material 192A to provide additional support. The back-up member 220A may be part of a larger assembly using the present electrical interconnect 210A.

Figure 16:
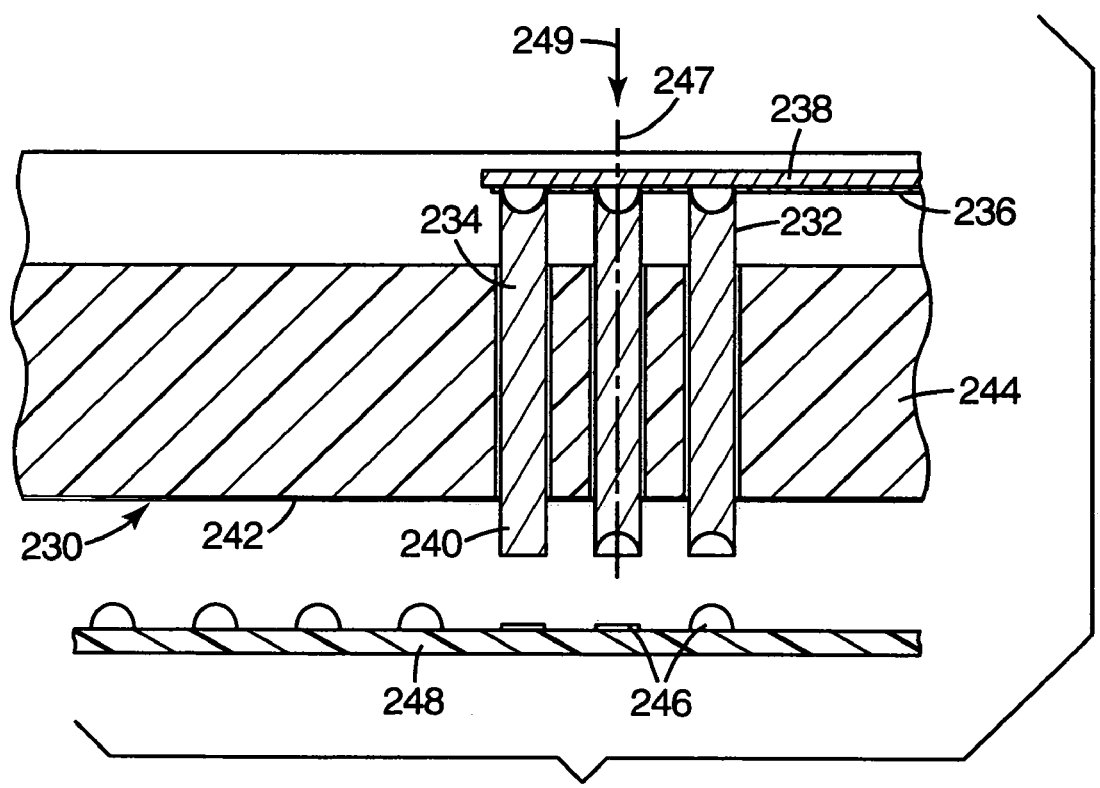
FIG. 16 is a side sectional view of an electrical interconnect assembly in accordance with the present invention engaged with a second circuit member.

FIG. 16 is a side sectional view of an electrical interconnect assembly 230 in accordance with the present invention. First ends 232 of the electrical contacts 234 are electrically coupled to a flexible circuit 236, using any of the techniques described herein. A compliant encapsulant or sheet material 238 is deposited on the rear surface of the flexible circuit 236. The second ends 240 of the electrical contacts 234 extend beyond the second surface 242 of the housing 244 to couple electrically with terminals 246 on a second circuit member 248. The terminals 246 may be a variety of structures such as, for example, a ball grid array, a land grid array, a pin grid array, contact points on a bare die device, etc. Similarly, the second ends 240 of the electrical contacts 234 can be a variety of shapes as discussed herein. The second circuit member 248 can be a printed circuit board, another flexible circuit, a ribbon cable, a bare die device, an integrated circuit device, organic or inorganic substrates, a rigid circuit or a variety of other electrical components.

In the illustrated embodiment, the electrical interconnect assembly 230 is releasably coupled to the second circuit member 248 by a compressive force 249. The compliance of the flexible circuit member 236, complaint material 238 and encapsulating material between the electrical contacts 234 and the housing 244, if any, provides the electrical contacts 234 with a large range of compliance along the central axes 247. Consequently, a stable electrical connection can be formed without permanently bonding the second ends 240 to the terminals 246. The electrical interconnect assembly 230 can serve as a die level test probe, a wafer probe, a printed circuit probe, or a variety of other test circuits. The various complaint members in the assembly 230 permit it to be oriented in any direction without interfering with its functionality.

The nature of the flexible circuit member 236 allows for a high density routing to external circuitry or electronics. The present electrical interconnection methodology can be extended to the distal end of the flexible circuit member 236 as well, to achieve a high performance connection where previous methods relied on cabling, spring probes, or masses of bundled wires.

Figure 17:
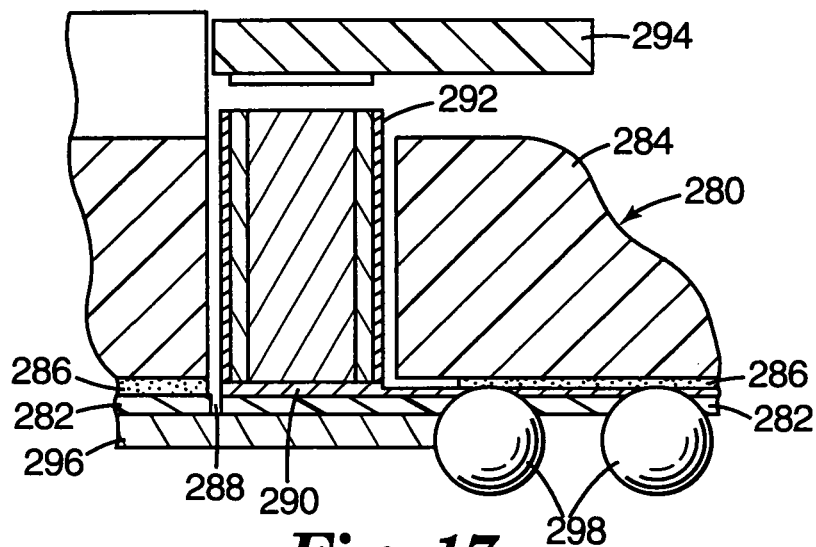
FIG. 17 is a side sectional schematic illustration of an electrical interconnect assembly in which both surfaces of the flex circuit member are used for forming electrical connections.

FIG. 17 is a side sectional schematic illustration of an electrical interconnect assembly 280 in which both surfaces of the flex circuit member 282 can be used for forming electrical connections. The flex circuit member 282 is bonded to housing 284 by an adhesive 286. Singulation 288 is formed in the flex circuit members 282 around trace 290. Electrical contact 292 is positioned to be compressively engaged with the trace 290 between circuit member 294 and controlled compliance layer 296 (see generally FIGS. 15A and 15). Solder balls 298 electrically coupled with one or more traces are located on the opposite side of the flex circuit member 282 for engagement with circuit members or other electrical interconnect assemblies.

Figure 18:
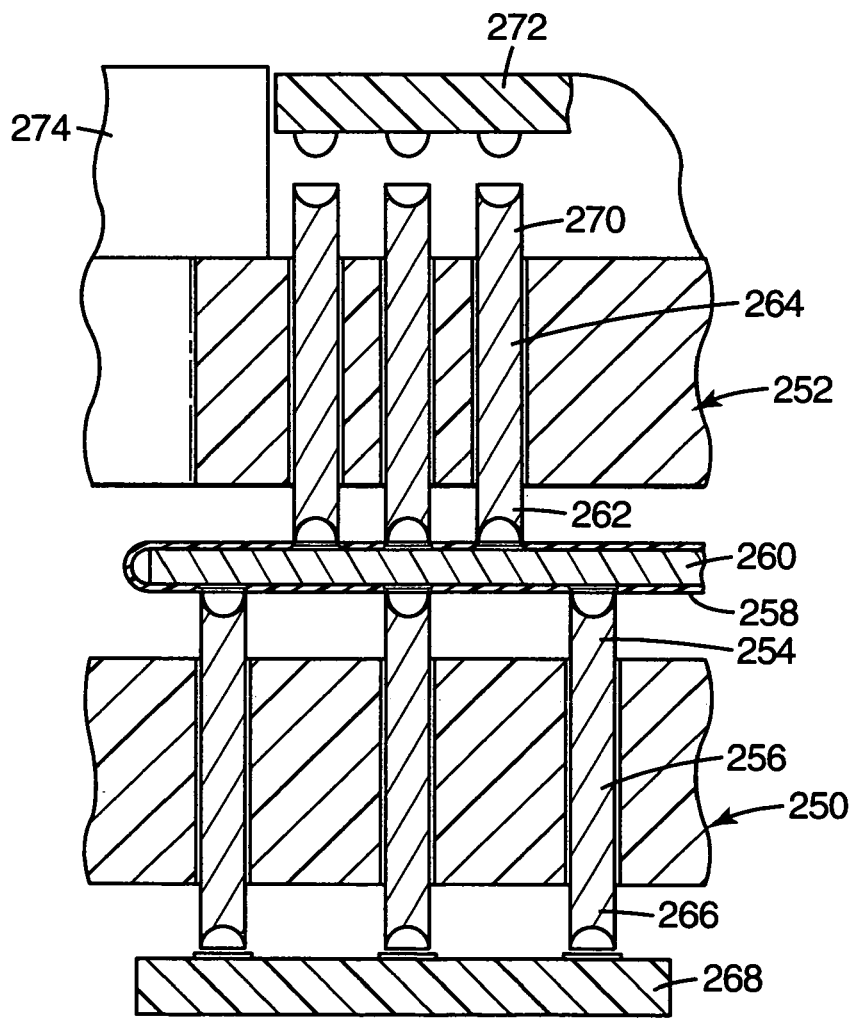
FIG. 18 is a side sectional view of two electrical interconnects in accordance with the present invention in a stacked configuration.

FIG. 18 is a schematic illustration of two electrical interconnect assemblies 250, 252 arranged in a stacked configuration in accordance with the present invention. First ends 254 of the electrical contacts 256 are electrically coupled with a flexible circuit member 258. The flexible circuit member 258 is folded around a compliant layer 260 so that first ends 262 of electrical contacts 264 in the electrical interconnect assembly 252 are also electrically coupled to the flexible circuit member 258. Second ends 266 of the electrical contacts 256 are electrically coupled with a second circuit member 268. Second ends 270 of the electrical contacts 264 are electrically coupled with circuit member 272. An alignment member 274 is optional provided on the interconnect assembly 252 to position the circuit member 272 relative to the electrical contacts 264. The electrical interconnect assemblies 250, 252 of FIG. 17 permit two circuit devices 268, 272 to be arranged in a stacked configuration.

Figure 19:
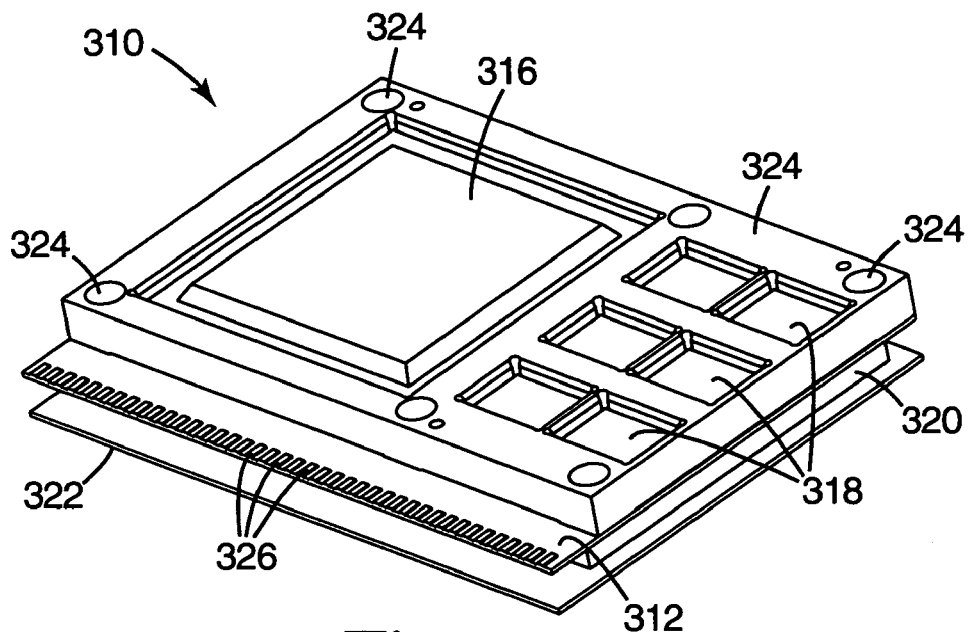
FIG. 19 is a replaceable chip module coupled to a flexible circuit member using the controlled compliance interconnect of the present invention.

FIG. 19 illustrates a replaceable chip module 310 coupled to a flexible circuit member 312 using the controlled compliance interconnect of the present invention. Housing 314 has a plurality of device sites 316, 318 for receiving circuit members, such as an array of integrated circuit devices. The device sites 316, 318 are recesses that each contain an array of electrical contacts, such as discussed herein. The housing 314 is retained against the flexible circuit member 312 using any of the methods discussed herein, such as mechanical fasteners, adhesives, secondary fixtures, etc. A controlled compliance layer 320 is optionally located behind the flexible circuit member 312. A stiffener 322 is optionally located behind the controlled compliance layer 320. The flexible circuit member 312 can be formed with or without singulation. In the illustrated embodiment, the flexible circuit member has a series of terminals 326 for electrically coupling the replaceable chip module 310 with another circuit member. Alignment holes 324 are optionally provided on the housing 314 for receiving a cover (not shown) that retains circuit members in the device sites 316, 318 and provides a compressive force.

The housing 314 allows for a great deal of configuration flexibility, such that it can be populated, upgraded, enhanced, or modified simply by removing, replacing, or adding individual circuit members or devices. The replaceable chip module 310 of FIG. 19 is suited as a test fixture for evaluating circuit members. Conventional test or load boards used as the interface for testing electrical devices can be greatly simplified or in some cases completely eliminated along with the supporting mechanical and electrical support or interface structure. The replaceable chip module technology disclosed in U.S. patent Ser. No. 08/955,563, entitled Replaceable Chip Module, is suitable for use in the present invention.

Figure 20:
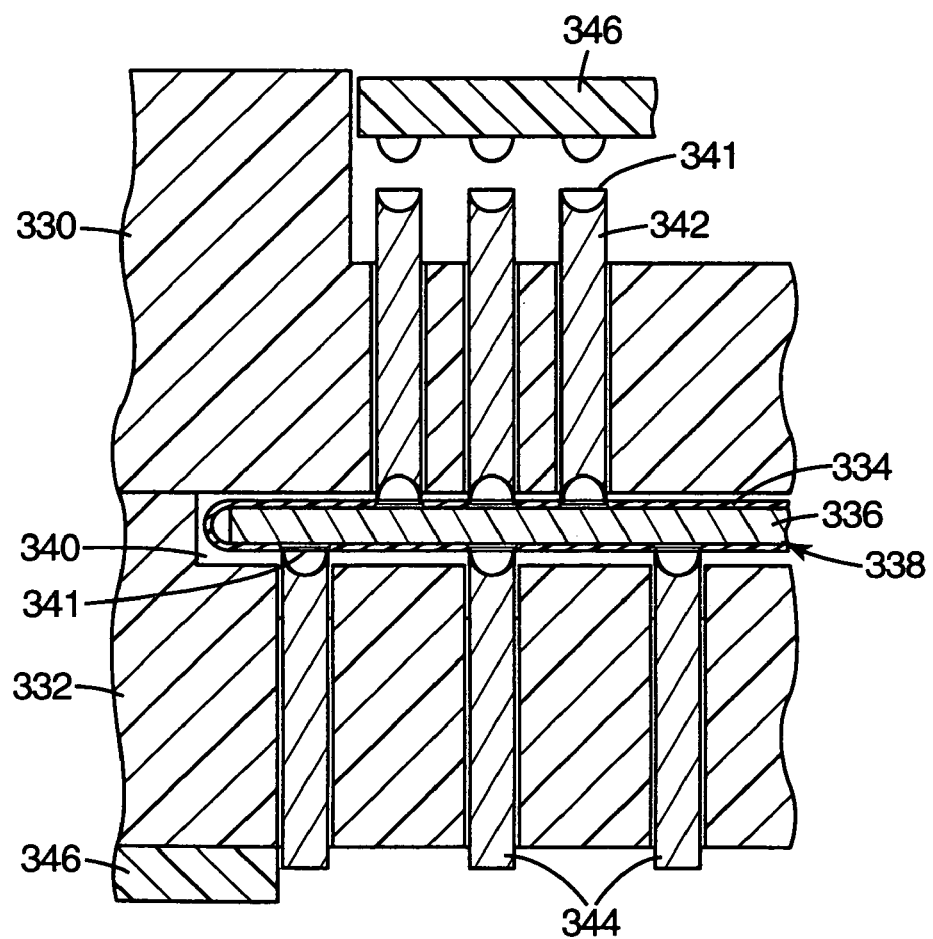
FIG. 20 is a pair of replaceable chip modules in a stacked configuration coupled by a flexible circuit member using the controlled compliance interconnect of the present invention.

FIG. 20 is a side sectional schematic illustration of a pair of replaceable chip module 330, 332 using the controlled compliance interconnect of the present invention in a stacked configuration, coupled together by a flexible circuit member 334. The flexible circuit member 334 is folded around a compliant layer 336, such as is illustrated in FIG. 18. The assembly 338 of the folded flexible circuit member 334 and compliant layer 336 is retained in a cavity 340 formed between the first replaceable chip module 330 and the second replaceable chip module 332. The various interfaces 341 between the flexible circuit member 334 and the electrical contacts 342, 344 of the respective replaceable chip modules 330, 332 can be formed using any of the techniques disclosed herein. For example, the electrical contacts 342 are illustrated as coupling with a ball grid array on circuit member 346. Electrical contacts 344 can couple with another replaceable chip module, another flexible circuit members or various circuit members. An alignment structure 346 may optionally be located on the second replaceable chip module 332 for positioning circuit members.

Figure 21:
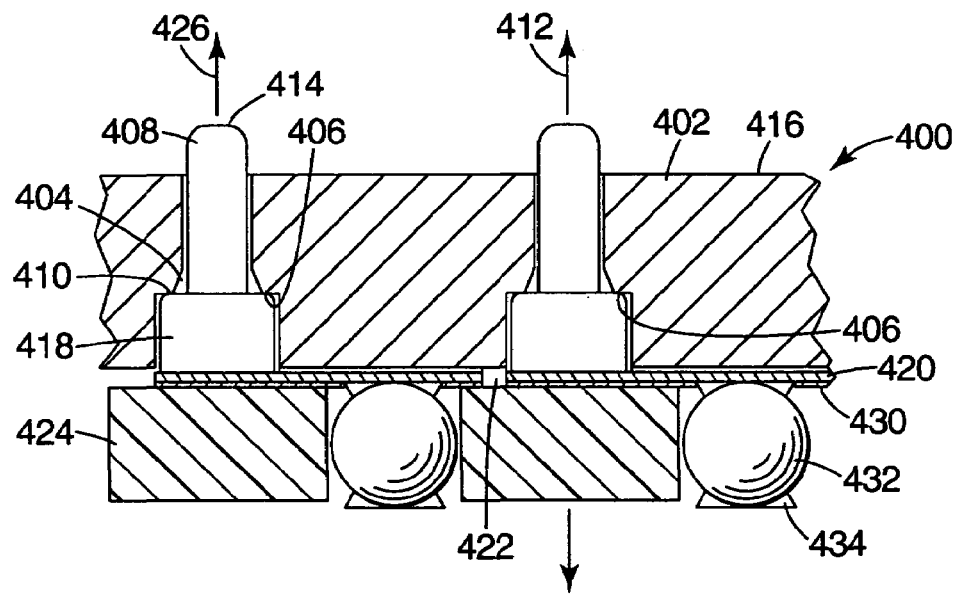
FIG. 21 is a side sectional view of an electrical interconnect bonded to a two-sided flexible circuit in accordance with the present invention.

FIG. 21 is a side sectional view of an electrical interconnect 400 in accordance with the present invention. Housing 402 includes an array of holes 404 each having a step 406. Electrical contacts 408 include a shoulder 410 adapted to engage with the step 406. Consequently, the electrical contacts 408 can move in the holes 404 along the central access 412 until the shoulders 410 engage with the steps 406. First ends 414 of the electrical contacts 408 extend above surface 416 of housing 402.

Second ends 418 of the electrical contacts 408 are electrically coupled to contact pads on flexible circuit member 420 using any of the methods discussed herein. The flexible circuit member optional includes singulations 422 adjacent to one or more of the electrical contacts 408. A compliant material 424 is positioned on the opposite side of the flexible circuit member 420 behind the second ends 418 of each of the electrical contacts 408. The compliant material 424 biases the electrical contacts 408 in the direction 426.

The second surface 430 of the flexible circuit member 420 optionally includes a series of solder balls 432 electrically coupled to traces on the flexible circuit member 430. Solder paste 434 may optionally be applied to the solder balls 432.

Figure 22:
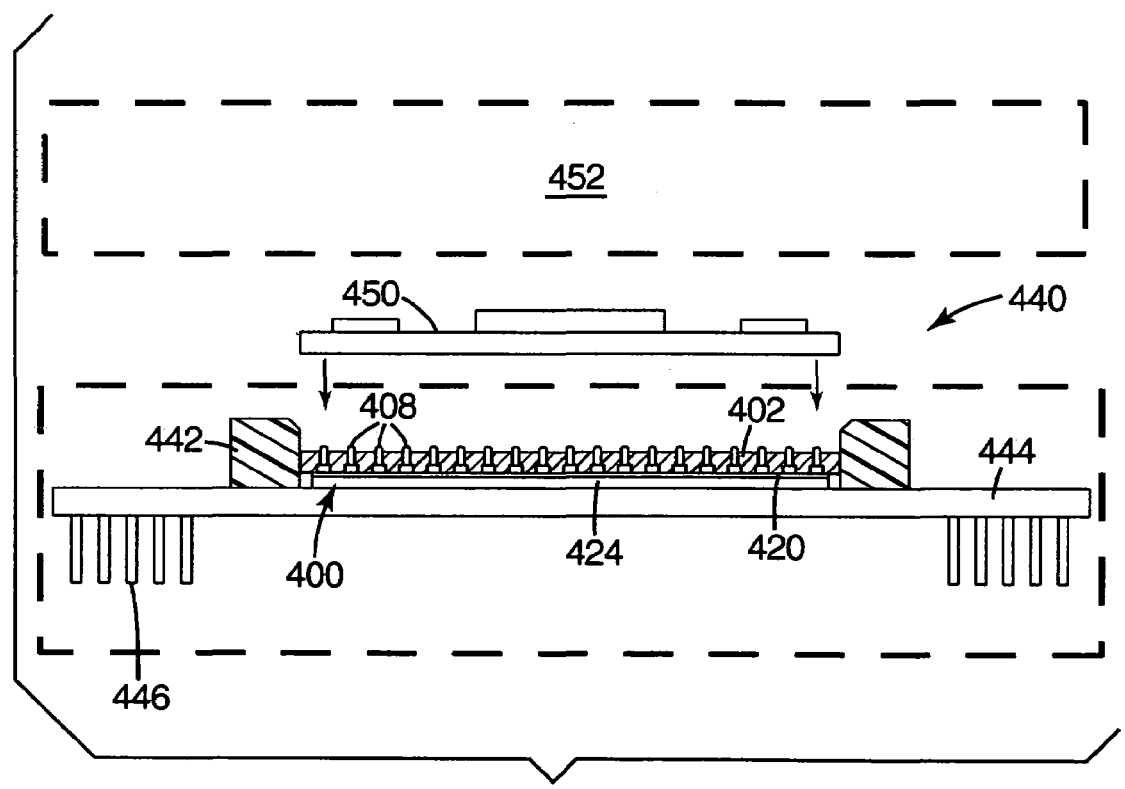
FIG. 22 is a side sectional view of an electrical interconnect assembly in accordance with the present invention.

FIG. 22 illustrates an electrical interconnect assembly 440 utilizing the electrical interconnect 400 of FIG. 21. The electrical interconnect 400 is located in an alignment device 442 positioned on a first circuit member 444. Flexible circuit member 420 (see FIG. 21) extends beyond the alignment device 442 to connect with another circuit member. The solder balls 432 (see FIG. 21) electrically couple the flexible circuit member 420 with contact pads on the circuit member 444. In the illustrated embodiment, the circuit member 444 is a printed circuit board or adapter. The circuit member 444 will typically include an additional connector, such as an edge card connector or the socket 7 compatible BGA adapter 446 illustrated in FIG. 22.

A second circuit member 450 is compressively engaged with the electrical interconnect 400. Alignment device 442 ensures that the contact pads on the second circuit member 450 align with the electrical contacts 408 on the electrical interconnect 400. Compliant material 424 biases the electrical contacts 408 into engagement with the contact pads on the second circuit member 450. In the illustrated embodiment, the second circuit member 450 is a land grid array (LGA) device. A heat sink 452 is optionally provided to retain the second circuit member 450 in compressive engagement with the electrical interconnect 400.

Figure 23:
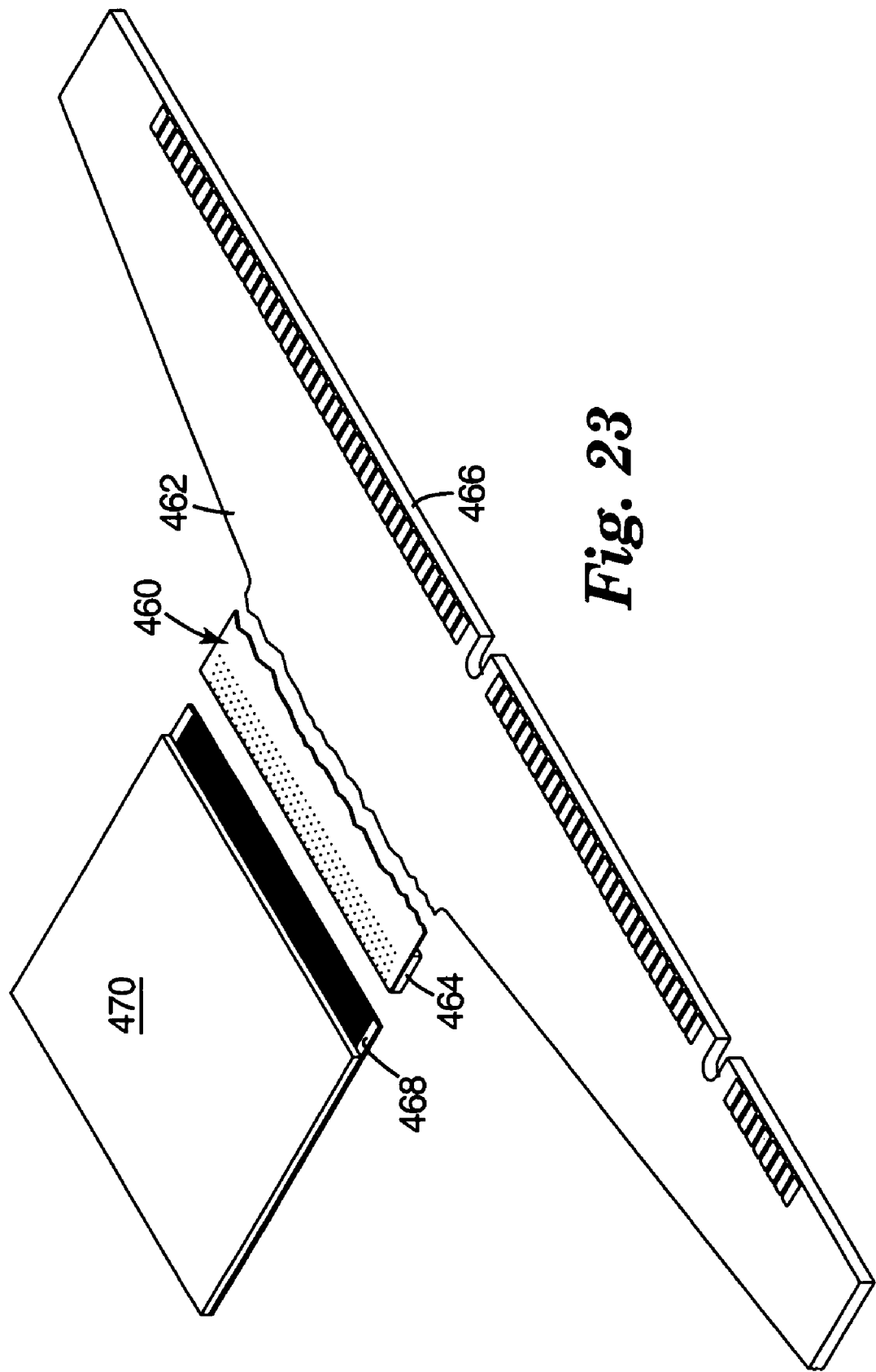
FIG. 23 is a perspective view of an electrical interconnect coupled to a display in accordance with the present invention.

FIG. 23 illustrates an alternate electrical interconnect 460 in accordance with the present invention. Flexible circuit member 462 is electrically coupled to an array of pins (see generally FIG. 21) retained in housing 464. The flexible circuit member 462 may optionally include an edge card connector 466. The pins in the electrical interconnect 460 are compressively engaged with a land grid array device 468 on circuit member 470. In the illustrated embodiment, circuit member 470 is a display device. The embodiment illustrated in FIG. 23 is particularly suited for use in lap top computers where the flexible circuit member 462 permits the display 470 to be hinged to the chassis of the computer.

Figure 24:
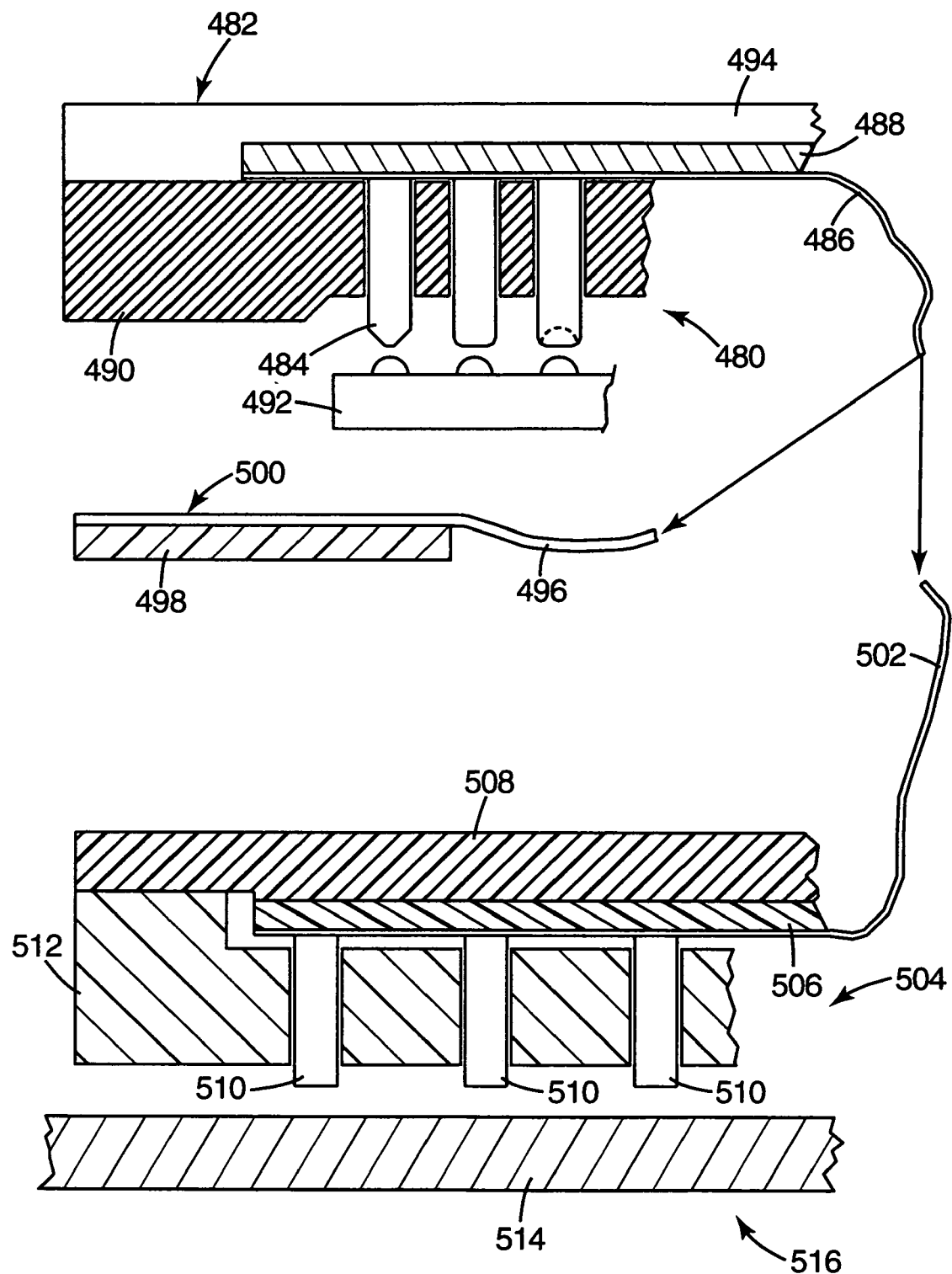
FIG. 24 is a schematic illustration of an electrical interconnect used as a test probe in accordance with the present invention.

FIG. 24 is a schematic illustration of an electrical interconnect 480 used as a probe module 482 in accordance with the present invention. Electrical contacts 484 are electrically coupled to flexible circuit 486. Compliant material 488 supported by back-up member 494 biases the electrical contacts 484 within the probe housing 490 towards a first circuit member 492. The first circuit member 492 can be a variety of electrical devices or a wafer containing a plurality of electrical devices (see FIG. 25).

The flexible circuit 486 can extend to one or more circuit members. In the illustrated embodiment, the flexible circuit member 486 includes a first branch 496. The branch 496 includes a series of edge card pads (not shown) and a stiffening member 498 to form an edge card connector 500.

Second branch 502 extends to another electrical interconnect 504 that includes a compliant material 506, a backup member 508, and a series of electrical contacts 510 in a housing 512. The electrical interconnect 504 can be used to interface the probe module 482 to another circuit member 514, such as a printed circuit board.

The tester 516 illustrated in FIG. 24 is completely modular. Any of the components can be easily replaced to facilitate testing of a wide variety of circuit members 492. For example, a different probe module 482 can be supplied so that the array of electrical contacts 482 correspond with the contact pads on the circuit member 492. Alternatively, the electrical interconnect 504 can be easily attached to a different circuit member 514 for performing different tests.

Figure 25:
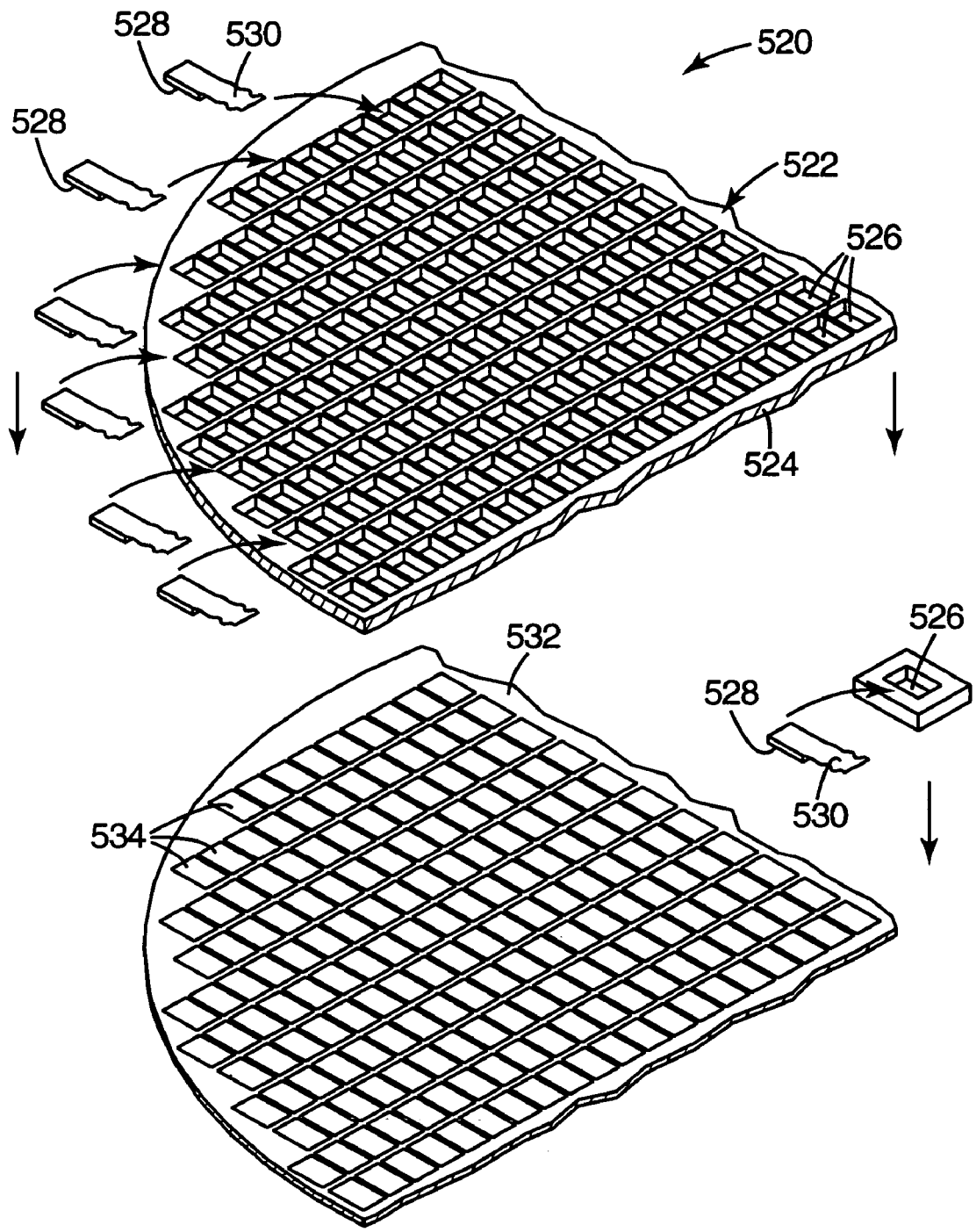
FIG. 25 is a perspective view of electrical interconnect used as a test probe for wafer level devices in accordance with the present invention.

FIG. 25 illustrates a system 520 for conducting full function testing at the wafer level. Electrical interconnect 522 includes a module holder 524 with a plurality of recesses 526. Each recess 526 is adapted to receive a probe module, such as illustrated in FIG. 24. Each of the probe modules 528 includes a flexible circuit 530 that can be electrically coupled with one or more other circuit members for purposes of performing the testing.

Wafer 532 includes a plurality of electrical devices 534. The array of recesses on the module holder 524 correspond to the array of electrical devices 534 on the wafer 532. The electrical interconnect 522 is placed over the wafer 532 so that the electrical contacts (see FIG. 24) of the probe modules 528 electrically couple with contact pads on the electrical devices 534. In one embodiment, the system 520 permits full speed testing of the electrical devices 534 at the wafer level.

Figure 26:
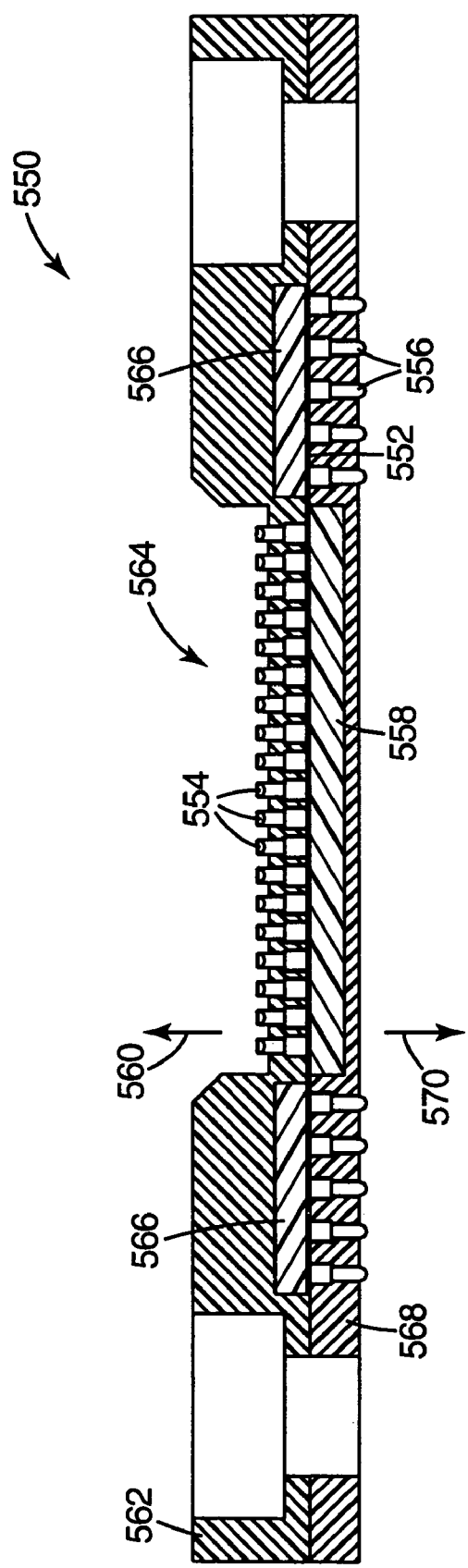
FIG. 26 is a side sectional view of a two-sided electrical interconnect in accordance with the present invention.

FIG. 26 is a schematic illustration of an alternate electrical interconnect 550 in accordance with the present invention. Flexible circuit member 552 electrically couples upper electrical contacts 554 and lower electrical contacts 556. Elastomer 558 is positioned to bias electrical contacts 554 upward in the direction 560. Upper housing 562 includes a recess 564 for receiving a variety of circuit members. Elastomer 566 biases lower electrical contacts 556 retained in the lower housing 568 in the direction 570 for coupling with another circuit member. In the embodiment illustrated in FIG. 26, the upper housing 562 is a separate component from the lower housing 568.

Figure 27A:
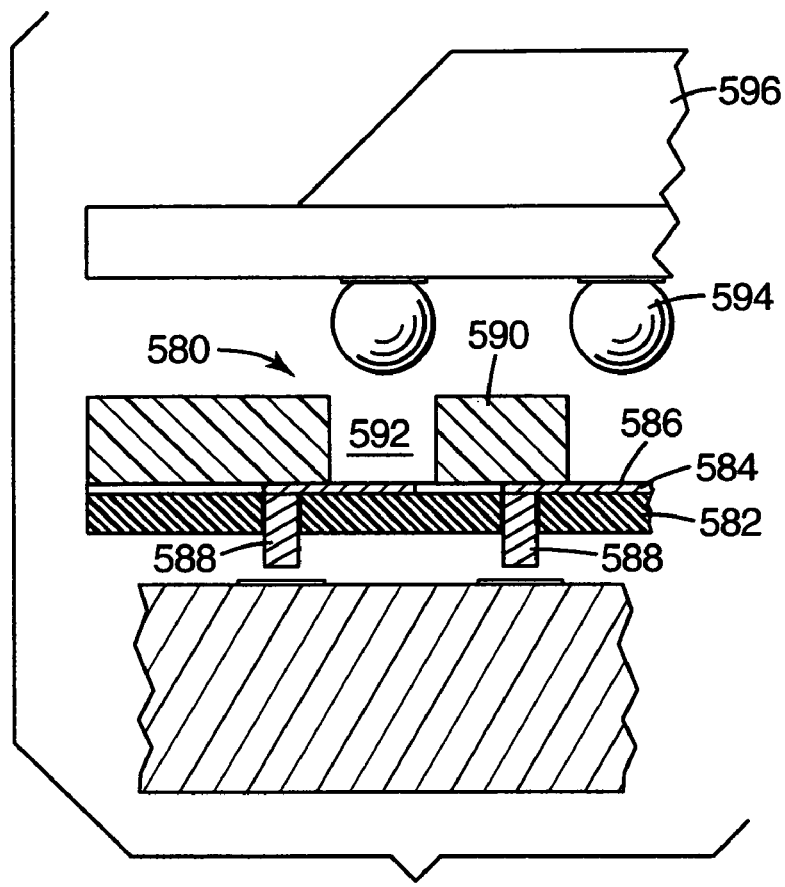
FIG. 27A is a side sectional view of an electrical interconnect assembly in a disengaged configuration in accordance with the present invention.

FIG. 27A is a schematic illustration of another electrical interconnect 580 in the disengaged configuration in accordance with the present invention. Substrate 582 supports a flexible circuit member 584 having a plurality of BGA contact pads 586. Electrical contacts 588 are electrically coupled to the opposite side of the flexible circuit member 584. Compliant member 590 is located behind each of the electrical contacts 588. Gaps 592 in the compliant member 590 permit solder balls 594 of a BGA device 596 to electrically couple with the BGA contact pads 586 on the flexible circuit member 584.

Figure 27B:
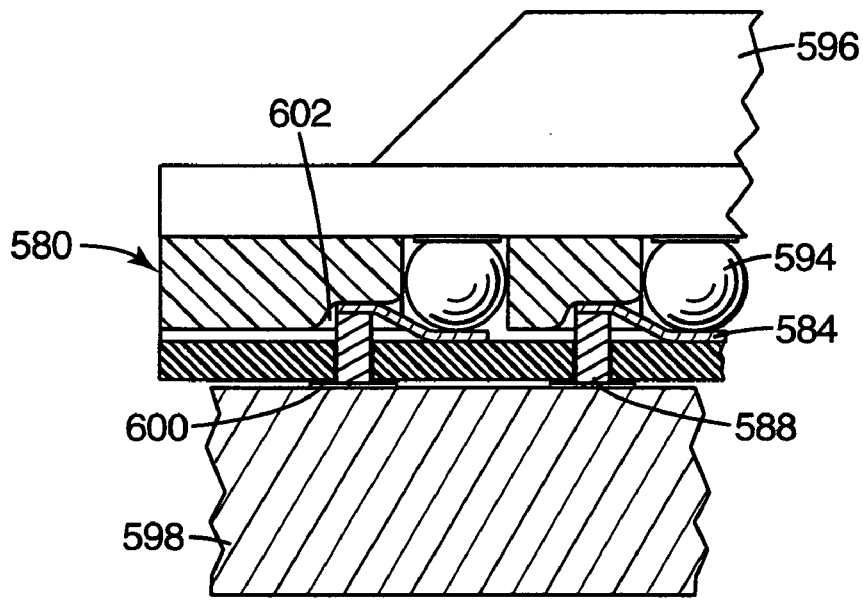
FIG. 27B is a side sectional view of the electrical interconnect assembly of FIG. 27A in an engaged configuration in accordance with the present invention.

FIG. 27B illustrates the electrical interconnect 580 of FIG. 27A in the engaged configuration. The electrical interconnect 580 is compressed between the BGA device 596 and a second circuit member, such as a printed circuit board 598. The contact pads 600 on the printed circuit board 598 bias the electrical contacts 588 toward the BGA device 596. The compliant material counteracts this bias on the electrical contacts 588. Singulations 602 in the flexible circuit member 584 facilitate movement of the electrical contacts 588 within the substrate 582. Solder balls 594 electrically couple with BGA contact pads 586 on the flexible circuit member 584.

Figure 28A:
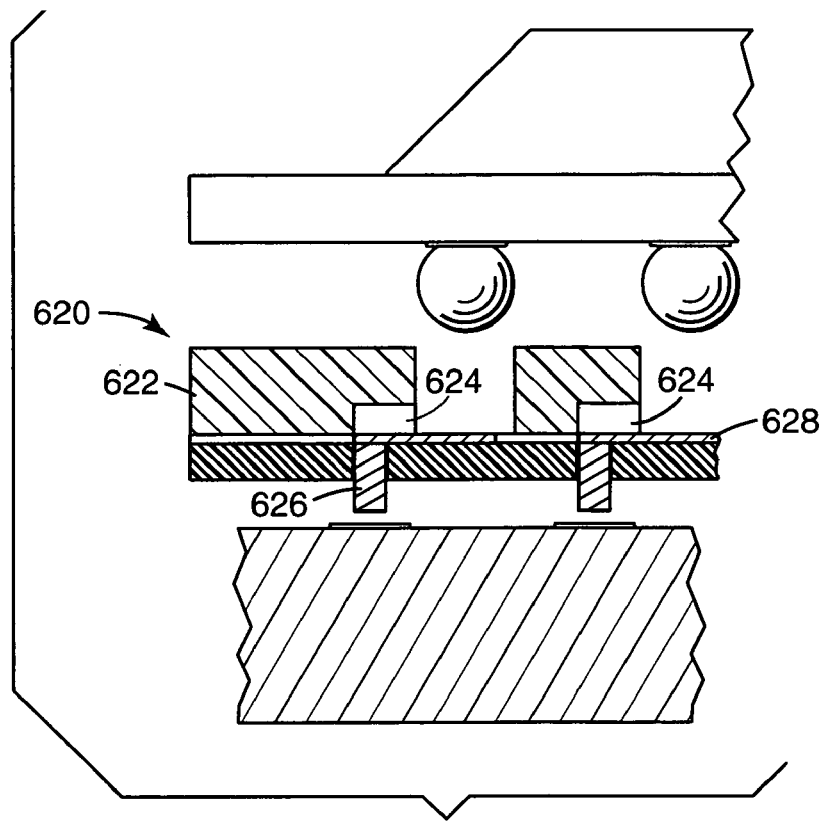
FIG. 28A is a side sectional view of an alternate electrical interconnect assembly in a disengaged configuration in accordance with the present invention.
Figure 28B:
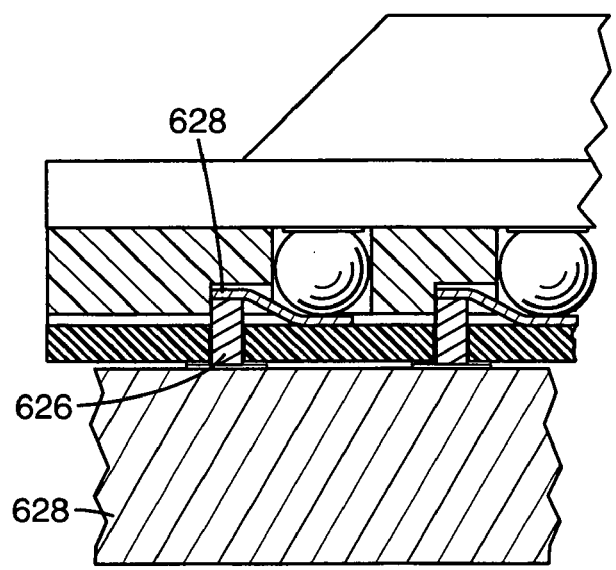
FIG. 28B is a side sectional view of the electrical interconnect assembly of FIG. 28B in an engaged configuration in accordance with the present invention.

FIG. 28A illustrates an electrical interconnect 620 substantially as shown in FIG. 27A, except that the compliant material 622 includes a clearance opening or recess 624 immediately behind the electrical contact 626.

In the engaged configuration illustrated in FIG. 27B, the electrical contacts 626 are biased toward the printed circuit board 628 only by the elastomeric properties of the flexible circuit member 628. In an alternate embodiment, the clearance opening 624 has a size that permits the electrical contact 626 to be supported substantially by the flexible circuit member 628 only for a portion of their travel. After an initial amount of travel by the electrical contact 626, the flexible circuit member 628 engages with the compliant material 622. Thereafter, further displacement of the electrical contact 626 is biased towards the printed circuit board 628 by a combination of the elastomeric properties of the flexible circuit member 628 and the compliant material 622.

Patents and patent applications disclosed herein, including those cited in the background of the invention, are hereby incorporated by reference. Other embodiments of the invention are possible. It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. An electrical interconnect assembly comprising:
   a flexible circuit member having a first surface with terminals and a second surface;
   a first housing having a plurality of through holes extending between a first surface and a second surface, the through holes comprising a pitch of less than about 0.4 millimeters;
   a plurality of electrical contact members positioned in at least a portion of the through holes, the electrical contact members having first ends electrically coupled and fixedly bonded with the terminals on the flexible circuit member, and second ends adapted to electrically couple with a second circuit member; and
   a compliant material positioned along the second surface of the flexible circuit member opposite at least one of the terminals to bias the second ends of the electrical contact member against the second circuit member.

2. The electrical interconnect assembly of claim 1 wherein the electrical contact members are electrically coupled to the flex circuit using one or more of a compressive force, solder, a wedge bond, a conductive adhesive, an ultrasonic bond and a wire bond.

3. The electrical interconnect assembly of claim 1 wherein at least one of the terminals on the flexible circuit member comprises a singulated terminal.

4. The electrical interconnect assembly of claim 1 wherein the complaint material comprises a sheet material.

5. The electrical interconnect assembly of claim 1 wherein the complaint material is discontinuous.

6. The electrical interconnect assembly of claim 1 wherein the second surface of the housing includes at least one device site adapted to receive the second circuit member.

7. The electrical interconnect assembly of claim 1 wherein the second ends of the electrical contact members have a shape that corresponds to a shape of the terminals on the second circuit member.

8. The electrical interconnect assembly of claim 1 wherein the second ends of the electrical contact members are capable of engaging with a connector member selected from the group consisting of a flexible circuit, a ribbon connector, a cable, a printed circuit board, a ball grid array (BGA), a land grid array (LGA), a plastic leaded chip carrier (PLCC), a pin grid array (PGA), a small outline integrated circuit (SOIC), a dual in-line package (DIP), a quad flat package (QFP), a leadless chip carrier (LCC), a chip scale package (CSP), or packaged or unpackaged integrated circuits.

9. The electrical interconnect assembly of claim 1 wherein the electrical contact members comprise a homogeneous material.

10. The electrical interconnect assembly of claim 1 wherein the electrical contact members comprise a multi-layered construction.

11. The electrical interconnect assembly of claim 1 wherein the electrical contact members have a cross-sectional shape selected from one of circular, oval, polygonal, and rectangular.

12. The electrical interconnect assembly of claim 1 wherein a portion of the flexible circuit member is bonded to the first surface of the housing.

13. The electrical interconnect assembly of claim 1 wherein the electrical contact members comprise at least one feature that limits movement in the first housing toward the second circuit member.

14. The electrical connector of claim 1 wherein electrical contact members have a larger cross section proximate the first end than at the second end.

15. The electrical connector of claim 1 wherein electrical contact members comprise a pitch of less than about 0.2 millimeters.

16. The electrical interconnect assembly of claim 1 wherein the plurality of through holes are arranged in a two-dimensional array.

17. The electrical interconnect assembly of claim 1 wherein the second ends of the electrical contact members comprises one or more of die level test probe, a wafer probe, and printed circuit board probe.

18. An electrical interconnect assembly comprising:
a module having a plurality of recesses; and
an electrical interconnect assembly as set forth in claim 1, located in a plurality of the recesses so that the second ends of the electrical contact members comprise test probes.

19. The electrical interconnect assembly of claim 18 wherein the second circuit member comprises a wafer having a plurality of electrical devices.

20. The electrical interconnect assembly of claim 18 wherein the recesses are arranged in a two-dimensional array corresponding to a two-dimensional array of electrical devices on the second circuit member.

21. The electrical interconnect assembly of claim 1 comprising:
a second housing having a plurality of through holes extending between a first surface and a second surface;
a plurality of electrical contact members positioned in at least a portion of the through holes, the electrical contact members having first ends electrically coupled with the terminals on the flexible circuit member, and second ends adapted to electrically couple with a third circuit member.

22. The electrical interconnect assembly of claim 21 wherein the first surface of the first housing is positioned opposite the first surface of the second housing.

23. The electrical interconnect assembly of claim 21 wherein the first housing and the second housing are arranged in a stacked configuration.

24. A method of making an electrical interconnect assembly, comprising the steps of:
preparing a housing having a plurality of through holes extending between a first surface and a second surface, the through holes comprising a pitch of less than about 0.4 millimeters;
positioning a first surface of a flexible circuit member against the first surface of the housing;
aligning a plurality of terminals on the first surface of the flexible circuit member with a plurality of the through holes;
positioning a plurality of electrical contact members in at least some of the through holes, the electrical contact members having first ends electrically coupled and fixedly bonded with the terminals on the flexible circuit member, and second ends adapted to electrically couple with a second circuit member; and
positioning a compliant material along a second surface of the flexible circuit member opposite at least one of the terminals to bias the second ends of the electrical contact member against the second circuit member.

25. The method of claim 24 comprising fixedly bonding the first ends of the electrical contact members to the terminals on the flexible circuit member.

26. The method of claim 24 comprising electrically coupling the first ends of the contact members to the flex circuit using one or more of a compressive force, solder, a wedge bond, a conductive adhesive, an ultrasonic bond and a wire bond.

27. The method of claim 24 comprising singulating at least one of the terminals on the flexible circuit member.

28. The method of claim 24 comprising positioning a sheet of compliant material along a second surface of the flexible circuit member opposite at least one of the terminals.

29. The method of claim 24 comprising positioning discontinuous sections of compliant material along a second surface of the flexible circuit member opposite at least one of the terminals.

30. The method of claim 24 comprising forming at least one device site adapted to receive the second circuit member along the second surface of the housing.

31. The method of claim 24 comprising forming the shape of the second end of the electrical contact members to correspond to a shape of the terminals on the second circuit member.

32. The method of claim 24 comprising forming the electrical contact members from a homogeneous material.

33. The method of claim 24 comprising forming the electrical contact members from a multi-layered construction.

34. The method of claim 24 comprising forming the electrical contact members to have a cross-sectional shape selected from one of circular, oval, polygonal, and rectangular.

35. The method of claim 24 comprising bonding a portion of the flexible circuit member to the first surface of the housing.

36. The method of claim 24 comprising forming the electrical contact members with a larger cross section proximate the first end than at the second end.

37. The method of claim 24 comprising arranging the electrical contact members with a pitch of less than about 0.2 millimeters.

38. The method of claim 24 comprising arranging the plurality of through holes in a two-dimensional array.

39. A method comprising:
    forming a plurality of recesses in a module; and
    locating an electrical interconnect assembly as set forth in claim 26, in a plurality of the recesses so that the second ends of the electrical contact members comprise test probes.

40. The method of claim 39 wherein the second circuit member comprises a wafer having a plurality of electrical devices, the method comprising positioning the second ends of the electrical contact members to electrically couple with the electrical devices on the second circuit member.

41. The method of claim 39 comprising arranging the recesses in a two-dimensional array corresponding to a two-dimensional array of electrical devices on the second circuit member.

42. The method of claim 24 comprising:
    a second housing having a plurality of through holes extending between a first surface and a second surface; and
    a plurality of electrical contact members positioned in at least a portion of the through holes in a second housing, the electrical contact members having first ends electrically coupled with the terminals on the flexible circuit member, and second ends adapted to electrically couple with a third circuit member.

43. The method of claim 42 comprising positioning the first surface of the first housing opposite a first surface of the second housing.

44. The method of claim 42 comprising arranging the first housing and the second housing in a stacked configuration.

* * * * *

UNITED STATES PATENT AND TRADEMARK OFFICE
CERTIFICATE OF CORRECTION

PATENT NO. : 7,160,119 B2 Page 1 of 1
APPLICATION NO. : 10/992482
DATED : January 9, 2007
INVENTOR(S) : James J. Rathburn It is certified that error appears in the above-identified patent and that said Letters Patent is hereby corrected as shown below:

On The Title Page, Item (56)
<u>References Cited Section</u>

Under the U.S. Patent Documents:

Delete "3,880,488" and replace it with -- 3,880,486 --

Signed and Sealed this

Twentieth Day of March, 2007

JON W. DUDAS
*Director of the United States Patent and Trademark Office*